(12) United States Patent
Ohmori et al.

(10) Patent No.: US 8,169,818 B2
(45) Date of Patent: May 1, 2012

(54) RECORDING METHOD FOR MAGNETIC MEMORY DEVICE

(75) Inventors: Hiroyuki Ohmori, Kanagawa (JP);
Masanori Hosomi, Kanagawa (JP);
Minoru Ikarashi, Kanagawa (JP);
Tetsuya Yamamoto, Kanagawa (JP);
Kazutaka Yamane, Kanagawa (JP);
Yuki Oishi, Kanagawa (JP); Hiroshi Kano, Kanagawa (JP)

(73) Assignee: Sony Corporation, Tokyo (JP)

( * ) Notice: Subject to any disclaimer, the term of this patent is extended or adjusted under 35 U.S.C. 154(b) by 38 days.

(21) Appl. No.: 12/937,325

(22) PCT Filed: Apr. 15, 2009

(86) PCT No.: PCT/JP2009/057622
§ 371 (c)(1),
(2), (4) Date: Oct. 11, 2010

(87) PCT Pub. No.: WO2009/128486
PCT Pub. Date: Oct. 22, 2009

(65) Prior Publication Data
US 2011/0032744 A1 Feb. 10, 2011

(30) Foreign Application Priority Data
Apr. 18, 2008 (JP) ................................. 2008-108479

(51) Int. Cl.
*G11C 11/00* (2006.01)
(52) U.S. Cl. ......... 365/158; 365/148; 365/171; 977/935
(58) Field of Classification Search .................... 365/48, 365/55, 62, 66, 74, 78, 80–93, 100, 130, 365/131, 148, 158, 171–173, 209, 213, 225.5, 230.07, 232, 243.5; 216/22; 257/295, 421, 257/E21.665; 438/3; 428/810–816, 817–825.1, 428/ 826; 977/933–935
See application file for complete search history.

(56) References Cited

U.S. PATENT DOCUMENTS
7,525,166 B2  4/2009 Hosomi et al.
(Continued)

FOREIGN PATENT DOCUMENTS
JP    2003-017782    1/2003
JP    2007-287923    11/2007
WO    2007/015358    2/2007

OTHER PUBLICATIONS
Roy Scheuerlein et al.; a 10ns Read and Write Non-Volatile Memory Array Using a Magnetic Tunnel Junction and FET Switch in each Cell; IEEE International Solid-State Circuits Conference; 2000.
(Continued)

*Primary Examiner* — Richard Elms
*Assistant Examiner* — Harry W Byrne
(74) *Attorney, Agent, or Firm* — SNR Denton US LLP

(57) ABSTRACT

A recording method for a magnetic memory device that includes applying, when recording one piece of information, one or more main pulses and one or more sub-pulses in the same direction and applying the one or more sub-pulses after the one or more main pulses, the one or more main pulses each being a pulse that has a sufficient pulse height and pulse width to record information, the one or more sub-pulses each being a pulse that satisfies at least one of conditions that a pulse width is shorter than that of the one or more main pulses and that a pulse height is smaller than that of the one or more main pulses.

6 Claims, 15 Drawing Sheets

(a) Example (b) Comparative example

U.S. PATENT DOCUMENTS

| | | | |
|---|---|---|---|
| 7,633,795 B2 * | 12/2009 | Shimomura et al. | 365/158 |
| 2007/0019337 A1 * | 1/2007 | Apalkov et al. | 360/324.1 |
| 2007/0159875 A1 * | 7/2007 | Shimomura et al. | 365/158 |
| 2009/0109736 A1 | 4/2009 | Katou | |
| 2010/0073998 A1 * | 3/2010 | Nakayama et al. | 365/158 |

OTHER PUBLICATIONS

F. J. Albert et al.; Spin-polarized current switching of a Co thin film nanomagnet; Applied Physics Letters; vol. 77, No. 23; 4 Dec. 2000.

International Search Report dated Jul. 14, 2009.

* cited by examiner (a)

(b)

(c)

(a) Memory device having average inversion threshold value (b) Memory device having high inversion threshold value (a) Memory device having average inversion threshold value (b) Memory device having high inversion threshold value (c) Memory device having low inversion threshold value (a) Example (b) Comparative example

RECORDING METHOD FOR MAGNETIC MEMORY DEVICE

TECHNICAL FIELD

The present invention relates to a recording method for a magnetic memory device including a recording layer that is capable of changing a magnetization direction and holds information as a magnetization direction of a magnetic body and a magnetization reference layer that is provided with respect to the recording layer with an insulation layer interposed therebetween and becomes a reference of the magnetization direction, the magnetic memory device being recorded with information by a current flowing between the recording layer and the magnetization reference layer via the insulation layer.

BACKGROUND ART

In information apparatuses such as a computer, a DRAM (Dynamic RAM) with which a high-speed operation and high-density recording are possible is widely used as a RAM (Random Access Memory). However, since the DRAM is a volatile memory in which information is deleted when power is turned off, a high-speed, high-density, and large-capacity nonvolatile memory that is capable of holding information even when power is shut off and is indispensable for reducing power consumption of an apparatus is strongly demanded.

A flash memory and the like is put to practical use as the nonvolatile memory, but a magnetic memory that uses a magnetoresistance effect is attracting attention and is thus being developed as a high-speed, large-capacity, and low-power-consumption nonvolatile memory in recent years. For example, an MRAM (Magnetic RAM) constituted of a magnetic memory device that uses a TMR (Tunnel Magnetoresistance) effect, that is, an MTJ device and onto which information is recorded by inverting a magnetization direction of a recording layer by a magnetic field induced by a current is put to practical use (e.g., MR2A16 (product name) available from Freescale Semiconductor, Inc.).

FIG. 9(a) is an explanatory diagram showing a basic structure of an MTJ device and an operation of reading out recorded information. As shown in FIG. 9(a), an MTJ device 100 has a structure in which a tunnel insulation layer 104 as a thin nonmagnetic insulation layer is interposed between a recording layer 105 and a magnetization reference layer 103 as two ferromagnetic layers, that is, a so-called MTJ (Magnetic Tunnel Junction). The recording layer 105 is constituted of a ferromagnetic conductor having uniaxial magnetic anisotropy and is capable of changing a magnetization direction by an external operation and holding the magnetization direction as information. For example, which of "parallel" and "nonparallel" the magnetization direction is with respect to a magnetization direction of the magnetization reference layer 103 is stored as information of "0" and "1".

For reading out information from the MTJ device 100, a TMR effect in which a resistance value with respect to a tunnel current that flows between the recording layer 105 and the magnetization reference layer 103 via the tunnel insulation layer 104 is changed by a relative difference in the magnetization directions between the two magnetic layers described above is used. The resistance value used herein takes a minimum value when the magnetization direction of the recording layer 105 and that of the magnetization reference layer 103 are parallel and takes a maximum value when the magnetization directions are nonparallel.

FIG. 9(b) is a partial perspective view showing an example of a memory cell structure of an MRAM constituted of the MTJ device 100. In the MRAM, a memory cell corresponding to 1 bit is formed by arranging word lines as row wirings and bit lines as column wirings in a matrix and arranging the MTJ device 100 at each intersection thereof.

At an upper portion of the memory cell, a write bit line 122 and a read bit line 123 are provided with an interlayer insulation film interposed therebetween, the MTJ device 100 is provided below the read bit line 123 while being in contact therewith, and a write word line 121 is provided below an extraction electrode layer 106 of the MTJ device 100 with an insulation layer interposed therebetween.

On the other hand, at a lower portion of the memory cell, a MOS (Metal Oxide Semiconductor)-type field-effect transistor is provided on a semiconductor substrate 111 such as a silicon substrate as a selection transistor 110 for selecting a memory cell at a time of a read operation. A gate electrode 115 of the transistor 110 is formed as a band connecting the cells and also functions as a read word line. Moreover, a source area 114 is connected to the extraction electrode layer 106 of the MTJ device 100 via a read connection plug 107, and a drain area 116 is connected to a sense line 124 as a read row wiring.

In the MRAM having the structure as described above, write (recording) of information to the MTJ device 100 of a desired memory cell is carried out by causing write currents to flow through the write word line 121 and the write bit line 122 of a row and column included in the memory cell and causing a synthetic magnetic field of magnetic fields generated by those currents at intersections of the two write wirings. By the synthetic magnetic field, the recording layer 105 of the MTJ device 100 of the desired memory cell is magnetized in a predetermined magnetization direction, that is, a direction that is "parallel" or "nonparallel" to the magnetization direction of the magnetization reference layer 103, to thus write (record) information.

Further, for reading out information from the MTJ device 100, a selection signal is applied to the gate electrode 115 as a read word line of a row included in a desired memory cell to put the entire selection transistor 110 of that row to an ON (conductive) state. At the same time, a read voltage is applied between the read bit line 123 of a column included in the desired memory cell and the sense line 124. As a result, only a desired memory cell is selected, and a difference of the magnetization direction of the recording layer 105 of the MTJ device 100 is detected as a difference in a level of a tunnel current flowing through the MTJ device 100 using the TMR effect. The tunnel current is extracted to a peripheral circuit (not shown) from the sense line 124 and measured.

It is reported that since the TMR-type MRAM is a nonvolatile memory from which information is read out using a magnetoresistance effect that is based on a spin-dependent conduction phenomenon unique to a nanomagnet and rewrite is performed by inverting a magnetization direction, rewrite can be practically performed an unlimited number of times and a high-speed access time is realized (see, for example, "ISSCC Digest of Technical Papers", R. Scheuerlein et al., pp. 128-129, February 2000).

However, in the MRAM on which write is performed using a current magnetic field, it is necessary to cause a large current (e.g., about several mA) to flow for rewrite, with the result that power consumption increases. Moreover, since a write wiring becomes thin while a current required for rewrite tends to increase along with a miniaturization of an MTJ device, it becomes difficult to cause a sufficient current for rewrite to flow. Further, with a progress of a high integration, a possibility of information being erroneously written in a different adjacent memory cell increases. Furthermore, since both a write wiring and a read wiring are required, a structure becomes complex. As a result, an increase in a density and capacity of the MRAM on which write is performed using a current magnetic field is limited.

In this regard, a magnetic memory device that uses a magnetization inversion by a spin injection for write is attracting attention as a device that writes (records) information onto a recording layer of a magnetic memory device based on a different principle. The spin injection is an operation of causing a current to flow through a ferromagnetic conductive layer (magnetization reference layer) whose magnetization direction is fixed to generate a current constituted of an electron ensemble whose spin direction is polarized in one direction (spin-polarized current) and injecting the current into a magnetic conductive layer (recording layer) that is capable of changing its magnetization direction. By such an operation, a force that acts to make the magnetization direction of the recording layer and that of the magnetization reference layer coincide (torque) is caused by a mutual action between a spin-polarized electron and an electron of a magnetic body constituting the recording layer at a time the spin-polarized current flows through the recording layer. Thus, by causing the spin-polarized current having a current density equal to or larger than a certain threshold value to flow, the magnetization direction of the recording layer can be inverted (see, for example, Patent Document 1 and Non-patent Document 1 to be described later).

FIG. 10 is a partial perspective view showing an example of a structure of an MRAM shown in Patent Document 2 to be described later, that is constituted of an MTJ device whose magnetization direction is inverted by a spin injection (hereinafter, referred to as spin injection MTJ device) and uses a magnetization inversion by the spin injection (hereinafter, referred to as spin torque MRAM). In the spin torque MRAM, word lines 215 as row wirings and bit lines 218 as column wirings are arranged in a matrix, and one spin injection MTJ device 220 is arranged at each intersection, to thus form a memory cell corresponding to 1 bit. FIG. 10 shows four memory cells.

On a semiconductor substrate 211 at a lower portion, a selection transistor 210 to be described later is formed in each memory cell, and the word line 215 also functions as a gate electrode of the selection transistor 210. Moreover, a drain area 216 is commonly formed for the selection transistors shown on both sides in the figure, and a row wiring 219 is connected to the drain area 216.

FIG. 11 is a partial cross-sectional diagram showing a memory cell structure of the spin torque MRAM. At a center portion of the memory cell, the spin injection MTJ device 220 is formed by laminating, in the stated order from the bottom layer, a base layer 201, an antiferromagnetic layer 202, a magnetization fixing layer 203*a*, an intermediate layer 203*b*, a magnetization reference layer 203*c*, a tunnel insulation layer 204, a recording layer 205, and a protective layer 206. The layer structure of the spin injection MTJ device 220 is basically the same as that of the normal MTJ device 100.

The magnetization fixing layer 203*a*, the intermediate layer 203*b*, and the magnetization reference layer 203*c* are laminated on the antiferromagnetic layer 20202 and constitute a fixed magnetization layer as a whole. A magnetization direction of the magnetization fixing layer 203*a* constituted of a ferromagnetic conductor is fixed by the antiferromagnetic layer 20202. The magnetization reference layer 203*c* similarly constituted of a ferromagnetic conductor forms an antiferromagnetic bond with the magnetization fixing layer 203*a* via the intermediate layer 203*b* as a nonmagnetic layer. As a result, a magnetization direction of the magnetization reference layer 203*c* is fixed in a direction opposite to the magnetization direction of the magnetization fixing layer 203*a*. In the example shown in FIG. 11, the magnetization direction of the magnetization fixing layer 203*a* is fixed in a left-hand direction, and the magnetization direction of the magnetization reference layer 203*c* is fixed in a right-hand direction.

Since a sensitivity of the fixed magnetization layer with respect to an external magnetic field can be lowered when the fixed magnetization layer has the multilayer ferrimagnetic structure described above, it is possible to suppress a magnetization fluctuation of the fixed magnetization layer due to the external magnetic field and improve a stability of the MTJ device. In addition, since magnetic fluxes that leak out from the magnetization fixing layer 203*a* and the magnetization reference layer 203*c* cancel each other out, the magnetic flux that leaks out from the fixed magnetization layer can be suppressed to a minimum level by adjusting film thicknesses of those layers.

The recording layer 5 is constituted of a ferromagnetic conductor having uniaxial magnetic anisotropy and capable of changing a magnetization direction by an external operation and holding the magnetization direction as information. For example, which of "parallel" and "nonparallel" the magnetization direction is with respect to the magnetization direction of the magnetization reference layer 203*c* is stored as information of "0" and "1". The tunnel insulation layer 204 as a thin nonmagnetic insulation layer is interposed between the magnetization reference layer 203*c* and the recording layer 205, and the magnetization reference layer 203*c*, the tunnel insulation layer 204, and the recording layer 205 form an MTJ (Magnetic Tunnel Junction).

On the other hand, at a lower portion of the memory cell, a MOS-type field-effect transistor constituted of a gate insulation film 212, a source electrode 213, a source area 214, a gate electrode 215, the drain area 216, and drain electrodes 217 is provided as the selection transistor 210 for selecting a memory cell in a device-isolated well area 211*a* of the semiconductor substrate 211 such as a silicon substrate.

As described above, the gate electrode 215 of the selection transistor 210 is formed as a band connecting the cells and also functions as a word line as a first row wiring. Moreover, the drain electrodes 217 are connected to the row wiring 219 as a second row wiring, and the source electrode 213 is connected to the base layer 201 of the spin injection MTJ device 220 via a connection plug 207. On the other hand, the protective layer 206 of the spin injection MTJ device 220 is connected to the bit line 218 as the column wiring provided at the upper portion of the memory cell.

For recording information onto the spin injection MTJ device 220 of a desired memory cell, a selection signal is applied to the word line 215 of a row included in the desired memory cell to put the entire selection transistor 210 of that row to an ON (conductive) state. At the same time, a write voltage is applied between the bit line 218 of a column included in the desired memory cell and the row wiring 219. As a result, a desired memory cell is selected, a spin-polarized current flows through the recording layer 205 of the spin injection MTJ device 220, and the recording layer 205 is magnetized in a predetermined magnetization direction, to thus record information.

At this time, the magnetization direction of the magnetization reference layer 203*c* of the spin injection MTJ device 220 is first "nonparallel" to the magnetization direction of the recording layer 205. When inverting the magnetization direction of the recording layer 205 to be "parallel" to the magnetization direction of the magnetization reference layer 203c by write, a write current having a current density equal to or larger than a threshold value is caused to flow from the recording layer 205 to the magnetization reference layer 203c as shown in FIG. 11. Accordingly, a spin-polarized electron stream having an electron density equal to or larger than a threshold value flows substantively from the magnetization reference layer 203c to the recording layer 205 to thus cause a magnetization inversion.

Conversely, when inverting the magnetization direction of the magnetization reference layer 203c that is "parallel" to the magnetization direction of the recording layer 205 to be "nonparallel", a write current having a current density equal to or larger than a threshold value is caused to flow in the opposite direction, that is, from the magnetization reference layer 203c to the recording layer 205 so that an electron stream having an electron density equal to or larger than a threshold value flows substantively from the recording layer 205 to the magnetization reference layer 203c.

Further, information is read out from the spin injection MTJ device 220 using the TMR effect as in the case of the MTJ device 100. While write and read with respect to the spin injection MTJ device 220 both use a mutual action between the electron of the recording layer 205 and the spin-polarized current that flows through the recording layer 205, read is performed in an area where the current density of the spin-polarized current is small, whereas write is performed in an area where the current density of the spin-polarized current is large and exceeds a threshold value.

Whether the magnetization inversion by the spin injection can be performed depends on the current density of the spin-polarized current. Thus, as a volume of the recording layer decreases in the spin injection MTJ device 220, the magnetization inversion can be performed with a smaller current in proportion to the volume (see Non-patent Document 1). Further, since information is written to a memory cell selected by the selection transistor 210, there is no fear of information being erroneously written to a different adjacent cell unlike write that uses a current magnetic field. Furthermore, since most of the wirings can be shared in write and read, a mechanism can be simplified. Moreover, since an influence of a shape of a magnetic body is smaller than that in the case of the write that uses a magnetic field, a yield ratio in production is apt to increase. Based on those points, the spin torque MRAM is more suited for realizing a miniaturization and an increase in the density and capacity than the MRAM on which write is performed using a current magnetic field.

However, a different problem arises when write (recording) is performed using the selection transistor 210. Specifically, a current that can be caused to flow through the spin injection MTJ device 220 at the time of write is limited by a current that can be caused to flow through the selection transistor 210 (saturation current of transistor). In general, since the saturation current of the transistor becomes smaller as a gate width or gate length of the transistor becomes smaller, a miniaturization of the selection transistor 210 is limited for securing a write current to the spin injection MTJ device 220. Therefore, for miniaturizing the selection transistor 210 as much as possible and maximumly increasing the density and capacity of the spin torque MRAM, it is necessary to reduce a threshold value of a write current as much as possible.

Moreover, also for preventing an insulation breakdown of the tunnel insulation layer 204 from occurring, it is necessary to reduce a threshold value of a write current. In addition, also for reducing power consumption of the MRAM, it is necessary to reduce a threshold value of a write current as much as possible.

It is phenomenologically shown that a threshold value of a current required for the magnetization inversion by a spin injection is proportional to a spin brake constant $\alpha$, a square of a saturated magnetization amount Ms, and a volume V of the recording layer 205 and inversely proportional to a spin injection efficiency $\eta$. Therefore, by appropriately selecting them, a threshold value of a current required for the magnetization inversion can be reduced.

On the other hand, however, for the spin injection MTJ device 220 to be a reliable memory device, it is necessary to secure memory holding characteristics (thermal stability of magnetization) of the recording layer 205 so that the magnetization direction does not change by a thermal motion. The thermal stability is proportional to the saturated magnetization amount Ms and the volume V of the recording layer 205.

The saturated magnetization amount Ms and the volume V of the recording layer 205 relate to both a threshold value of a current required for the magnetization inversion and the thermal stability and are in a tradeoff relationship in which, by reducing a threshold value of a current required for the magnetization inversion by reducing those factors, the thermal stability is also lowered.

Therefore, it is necessary to improve, for reducing a threshold value of a current required for the magnetization inversion, mainly the spin injection efficiency $\eta$ while carefully taking a balance with a securement of the thermal stability. The inventors of the present invention have vigorously developed an MTJ material that is capable of realizing both a reduction in a threshold value of a current density required for a magnetization inversion and a securement of memory holding characteristics (thermal stability) so that a spin torque MRAM becomes a competitive memory as compared to other memories (see Japanese Patent Application Laid-open No. 2006-165265, Japanese Patent Application Laid-open No. 2007-103471, Japanese Patent Application Laid-open No. 2007-48790, Patent Document 2, Japanese Patent Application No. 2006-350113, etc.). As a result, the MTJ material is now close to being realized.

Patent Document 1: Japanese Patent Application Laid-open No. 2003-17782 (p. 6 and 7, FIG. 2)
Patent Document 2: Japanese Patent Application Laid-open No. 2007-287923 (p. 7-15, FIG. 2)
Non-patent Document 1: "Appl. Phys. Lett.", F. J. Albert et al., Vol. 77 (2002), p. 3809

DISCLOSURE OF THE INVENTION

Problems to be Solved by the Invention

However, as a result of producing a spin injection MTJ device having a small threshold value of a write current density using the MTJ material described above and examining it, the inventors of the present invention have found that, conventionally, a peculiar phenomenon unreported even in research papers and conference presentations appears. Specifically, in the spin injection MTJ device, it has been confirmed that, irrespective of the fact that a write error rate of $10^{-25}$ or less can be secured (as an estimated value obtained by an extrapolation) when a write pulse to be applied is set to be a little larger than an inversion threshold value in consideration of the write error rate, when the write pulse to be applied is set to be considerably larger than the inversion threshold value, the write error rate tends to rather increase as the write pulse becomes larger (see FIG. 12). Here, an error that is caused by a recording voltage larger than the inversion threshold value is referred to as "high recording voltage error".

In the actual write to a spin torque MRAM memory chip having a capacity of several-hundred Mbit, a write pulse considerably larger than a mean value of the inversion threshold values is set to be applied while taking into account a variation of the inversion threshold value of the spin injection MTJ device and a variation of the inversion threshold value that is due to the transistor and wirings. Therefore, if the phenomenon described above appears, a write error rate of $10^{-25}$ or less cannot be secured in the actual write to the spin torque MRAM memory chip.

Moreover, since the MRAM and the spin torque RAM hold information as a magnetization direction of a magnetic body constituting the recording layer, the magnetization direction of the recording layer is changed when exposed to a strong external magnetic field, with the result that information is lost. Since durability with respect to an external magnetic field is prominently lowered particularly during a write (recording) process, a magnetic shield for reducing the external magnetic field that acts on the magnetic memory device, that is also equipped in the commercially-available MRAM described above (MR2A16), is essential. For obtaining a magnetic field shield effect with the magnetic shield, however, a certain level of thickness and volume are required, with the result that an increase in a volume and weight of a memory IC and an increase in costs cannot be avoided.

It is described in, for example, a document ("J. Phys. D.", K. Ito et al., Vol. 40, 2007, p. 1261) that particularly in a spin torque RAM, an external magnetic field influences a recording current and an inversion time, and another document ("Apl. Phys. Let.", G. D. Fuchs et al., Vol. 86, 2005, p. 152509) describes a possibility that durability with respect to an external magnetic field may be additionally lowered due to heat generated in a spin injection MTJ device by energization. Thus, it is necessary to enhance durability with respect an external magnetic field.

The present invention has been made in view of the circumstances as described above, and it is therefore an object of the invention to provide a recording method for a magnetic memory device including a recording layer that is capable of changing a magnetization direction and holds information as a magnetization direction of a magnetic body and a magnetization reference layer that is provided with respect to the recording layer with an insulation layer interposed therebetween and becomes a reference of the magnetization direction, the magnetic memory device being recorded with information by a current flowing between the recording layer and the magnetization reference layer via the insulation layer. The recording method for a magnetic memory device has enhanced durability with respect to an external magnetic field and is capable of securing a write error rate obtained when a write pulse a little larger than an inversion threshold value is applied even when a write pulse considerably larger than the inversion threshold value is applied.

Means for Solving the Problems

Devoting to the studies, the inventors of the present invention have found that the problems above can be solved by devising a write pulse application method and thus completed the present invention.

Specifically, according to the present invention, there is provided a recording method for a magnetic memory device including at least a recording layer that is constituted of a ferromagnetic conductor, capable of changing a magnetization direction, and holds information as a magnetization direction of a magnetic body and a magnetization reference layer whose magnetization direction is fixed and that is provided with respect to the recording layer with an insulation layer interposed therebetween, constituted of a ferromagnetic conductor, and becomes a reference of the magnetization direction, the magnetic memory device being recorded with information by a current flowing between the recording layer and the magnetization reference layer via the insulation layer, the recording method being characterized by including: applying, when recording one piece of information, one or more main pulses and one or more sub-pulses in the same direction; and applying the one or more sub-pulses after the one or more main pulses, the one or more sub-pulses to be applied after the one or more main pulses each being a pulse that satisfies at least one of conditions that a pulse width is shorter than that of the one or more main pulses and that a pulse height is smaller than that of the one or more main pulses.

It should be noted that the pulses may be controlled based on voltage control, current control, or power control.

Effect of the Invention

According to the recording method for a magnetic memory device of the present invention, by applying the one or more sub-pulses after the one or more main pulses in recording one piece of information and using, as the sub-pulses to be applied after the main pulses, a pulse that satisfies at least one of conditions that the pulse width is shorter than that of the main pulses and the pulse height is smaller than that of the main pulses as shown in embodiments and examples to be described later, even when a write pulse considerably larger than an inversion threshold value is applied, a write error rate equivalent to that obtained when a write pulse a little larger than the inversion threshold value is applied can be secured.

It cannot be said that a mechanism that causes the high recording voltage error described above and a mechanism with which a write error rate can be suppressed to be small by the present invention have become fully clear. However, considering the fact that no problem arises when a write pulse a little larger than the inversion threshold value is applied but a problem arises when a write pulse considerably larger than the inversion threshold value is applied and, in addition, a write error rate increases as the write pulse becomes larger, it can be predicted that an injection of an excessive amount of write power as compared to the inversion threshold value is inducing the problem.

In the conventional write that uses a single pulse, a write error caused by an injection of an excessive amount of write power is not corrected and left as it is, so a write error rate is high. Moreover, durability with respect to an external magnetic field during write is low. On the other hand, in the present invention, since the one or more sub-pulses are applied after the one or more main pulses, a write error caused by the main pulses can be highly-likely corrected by write by the sub-pulses. In addition, since the sub-pulses to be applied after the main pulses are pulses that satisfy at least one of the conditions that the pulse width is shorter than that of the main pulses and the pulse height is smaller than that of the main pulses, it is difficult for an excessive amount of energy to be accumulated in the write by the sub pulses and the high recording voltage error to appear. By the effect described above, a write error rate decreases and durability with respect to an external magnetic field during write is enhanced by the recording method for a magnetic memory device according to the present invention.

BEST MODES FOR CARRYING OUT THE INVENTION

In a recording method for a magnetic memory device according to the present invention, it is desirable to provide, in a pulse string constituted of one or more main pulses and one or more sub-pulses to be applied after the one or more main pulses, at least one set of three consecutive pulses in which at least one of a pulse width and a pulse height gradually reduces.

It is also desirable to provide a time interval of 3 ns or more between a terminal of the one or more main pulses and a tip end of the one or more sub-pulses to be applied after the one or more main pulses (note that the terminal and the tip end of the pulses are each a position at which a height of the pulses at times of fall and rise becomes half the maximum value of the pulse height; the same holds true in descriptions below).

Further, in a set of two consecutive pulses arbitrarily selected from a pulse string constituted of the one or more main pulses and the one or more sub-pulses to be applied after the one or more main pulses, it is also desirable for the subsequent pulse to satisfy at least one of conditions that a pulse width is 2 ns or more and 10 ns or less and that a pulse height is 0.7 times or more and 0.95 times or less the pulse height of the previous pulse, and a time interval of 5 ns or more to be provided between a terminal of the previous pulse and a tip end of the subsequent pulse.

Furthermore, in a set of two consecutive pulses arbitrarily selected from a pulse string constituted of the one or more main pulses and the one or more sub-pulses to be applied after the one or more main pulses, it is also desirable for the subsequent pulse to satisfy at least one of conditions that a pulse width is 3 ns or less and that a pulse height is 0.95 times or less the pulse height of the previous pulse, and a time interval between a terminal of the previous pulse and a tip end of the subsequent pulse to be smaller than 5 ns.

Next, embodiments of the present invention will be specifically described with reference to the drawings.

First Embodiment

In a first embodiment, an example of a recording method for a spin injection MTJ device according to claims 1 to 3 will mainly be described.

Figure 15:
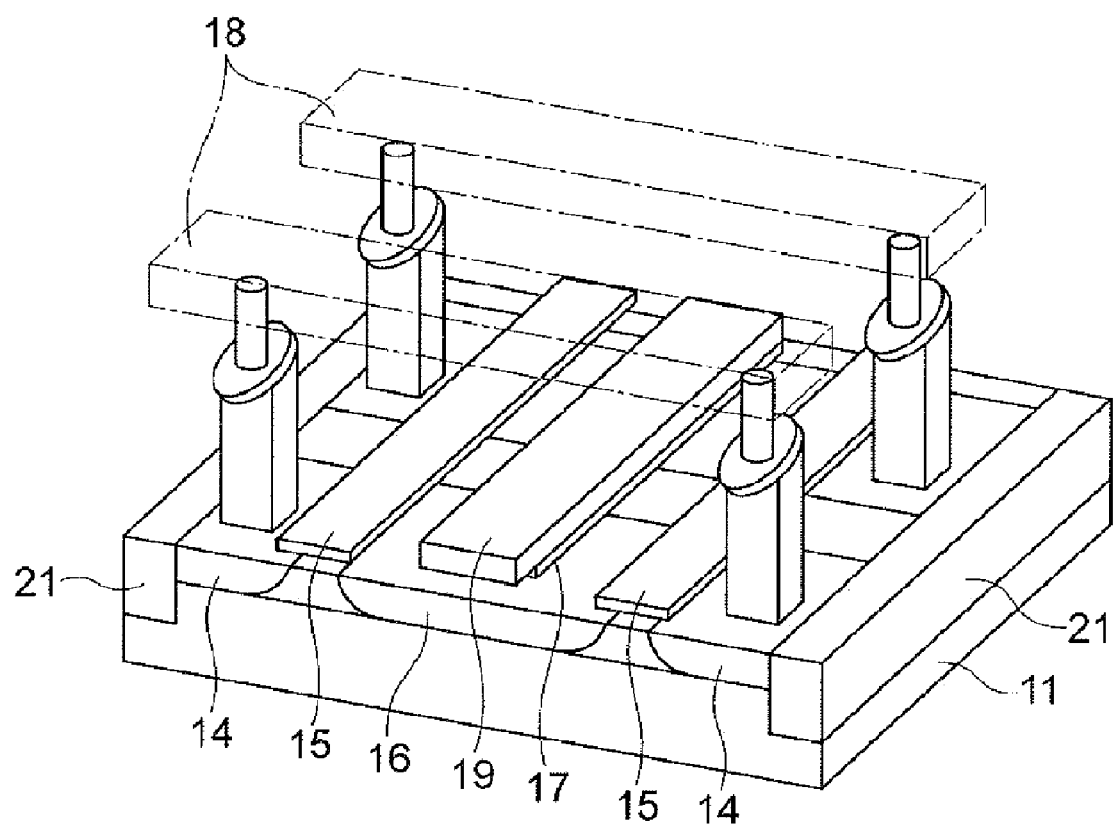
FIG. 15 is a partial perspective view showing a memory cell structure of a spin torque MRAM according to the embodiment of the present invention.
Figure 16:
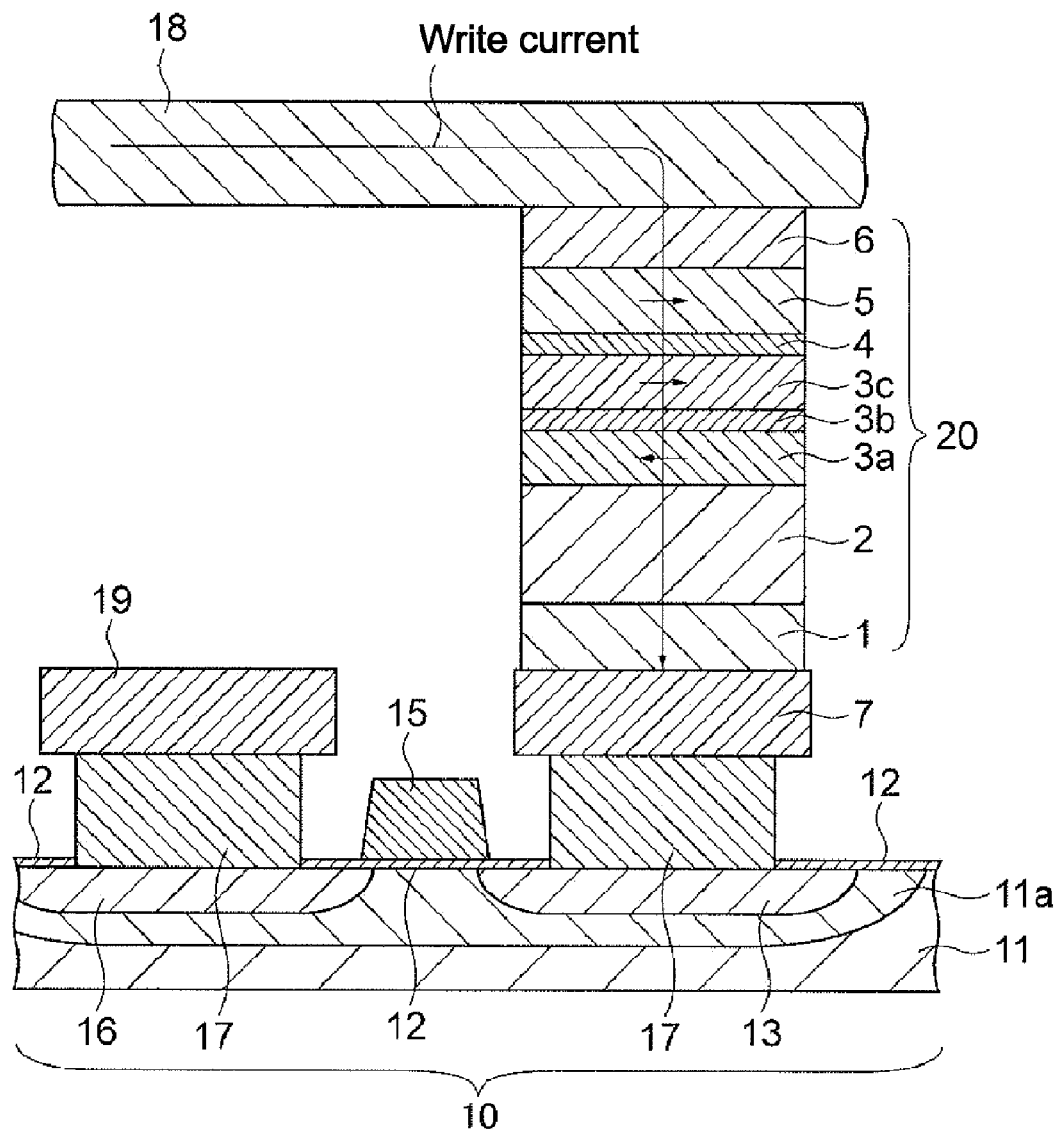
FIG. 16 is a cross-sectional diagram showing a structure of a spin injection MTJ device according to the embodiment of the present invention.

A memory cell structure of a spin torque MRAM used in this embodiment and a structure of a spin injection MTJ device are shown in FIGS. 15 and 16.

FIG. 15 is a partial perspective view showing an example of a structure of an MRAM that is constituted of an MTJ device whose magnetization direction is inverted by a spin injection (hereinafter, referred to as spin injection MTJ device) and uses a magnetization inversion by the spin injection (hereinafter, referred to as spin torque MRAM). In the spin torque MRAM, word lines 15 as row wirings and bit lines 18 as column wirings are arranged in a matrix, and one spin injection MTJ device 20 is arranged at each intersection, to thus form a memory cell corresponding to 1 bit. FIG. 15 shows four memory cells.

On a semiconductor substrate 11 at a lower portion, a selection transistor 10 to be described later is formed in each memory cell, and the word line 15 also functions as a gate electrode of the selection transistor 10. Moreover, a drain area 16 is commonly formed for the selection transistors shown on both sides in the figure, and a row wiring 19 is connected to the drain area 16.

FIG. 16 is a partial cross-sectional diagram showing a memory cell structure of the spin torque MRAM. At a center portion of the memory cell, the spin injection MTJ device 20 is formed by laminating, in the stated order from the bottom layer, a base layer 1, an antiferromagnetic layer 2, a magnetization fixing layer 3a, an intermediate layer 3b, a magnetization reference layer 3c, a tunnel insulation layer 4, a recording layer 5, and a protective layer 6.

The magnetization fixing layer 3a, the intermediate layer 3b, and the magnetization reference layer 3c are laminated on the antiferromagnetic layer 2 and constitute a fixed magnetization layer as a whole. A magnetization direction of the magnetization fixing layer 3a constituted of a ferromagnetic conductor is fixed by the antiferromagnetic layer 2. The magnetization reference layer 3c similarly constituted of a ferromagnetic conductor forms an antiferromagnetic bond with the magnetization fixing layer 3a via the intermediate layer 3b as a nonmagnetic layer. As a result, a magnetization direction of the magnetization reference layer 3c is fixed in a direction opposite to the magnetization direction of the magnetization fixing layer 3a. In the example shown in FIG. 16, the magnetization direction of the magnetization fixing layer 3a is fixed in a left-hand direction, and the magnetization direction of the magnetization reference layer 3c is fixed in a right-hand direction.

Since a sensitivity of the fixed magnetization layer with respect to an external magnetic field can be lowered when the fixed magnetization layer has the multilayer ferrimagnetic structure described above, it is possible to suppress a magnetization fluctuation of the fixed magnetization layer due to the external magnetic field and improve a stability of the MTJ device. In addition, since magnetic fluxes that leak out from the magnetization fixing layer 3a and the magnetization reference layer 3c cancel each other out, the magnetic flux that leaks out from the fixed magnetization layer can be suppressed to a minimum level by adjusting film thicknesses of those layers.

The recording layer 5 is constituted of a ferromagnetic conductor having uniaxial magnetic anisotropy and capable of changing a magnetization direction by an external operation and holding the magnetization direction as information. For example, which of "parallel" and "nonparallel" the magnetization direction is with respect to the magnetization direction of the magnetization reference layer 3c is stored as information of "0" and "1". The tunnel insulation layer 4 as a thin nonmagnetic insulation layer is interposed between the magnetization reference layer 3c and the recording layer 5, and the magnetization reference layer 3c, the tunnel insulation layer 4, and the recording layer 5 form an MTJ (Magnetic Tunnel Junction).

On the other hand, at a lower portion of the memory cell, a MOS-type field-effect transistor constituted of a gate insulation film 12, a source electrode 13, a source area 14, a gate electrode 15, the drain area 16, and drain electrodes 17 is provided as the selection transistor 10 for selecting a memory cell in a device-isolated well area 11a of the semiconductor substrate 11 such as a silicon substrate.

As described above, the gate electrode 15 of the selection transistor 10 is formed as a band connecting the cells and also functions as a word line as a first row wiring. Moreover, the drain electrodes 17 are connected to the row wiring 19 as a second row wiring, and the source electrode 13 is connected to the base layer 1 of the spin injection MTJ device 20 via a connection plug 7. On the other hand, the protective layer 6 of the spin injection MTJ device 20 is connected to the bit line 18 as the column wiring provided at the upper portion of the memory cell.

For recording information onto the spin injection MTJ device 20 of a desired memory cell, a selection signal is applied to the word line 15 of a row included in the desired memory cell to put the entire selection transistor 10 of that row to an ON (conductive) state. At the same time, a write voltage is applied between the bit line 18 of a column included in the desired memory cell and the row wiring 19. As a result, a desired memory cell is selected, a spin-polarized current flows through the recording layer 5 of the spin injection MTJ device 20, and the recording layer 5 is magnetized in a predetermined magnetization direction, to thus record information.

Figure 9:
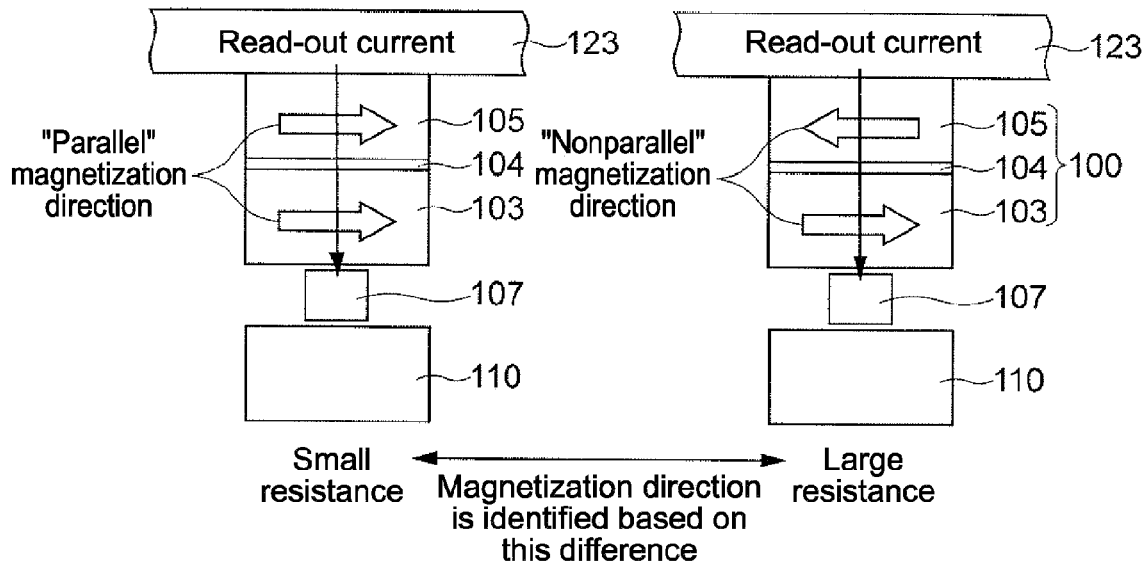
FIG. 9(a) is an explanatory diagram showing a basic structure of an MTJ device and an operation of reading out recorded information.
FIG. 9(b) is a partial perspective view showing an example of a memory cell structure of an MRAM constituted of the MTJ device.
Figure 9:
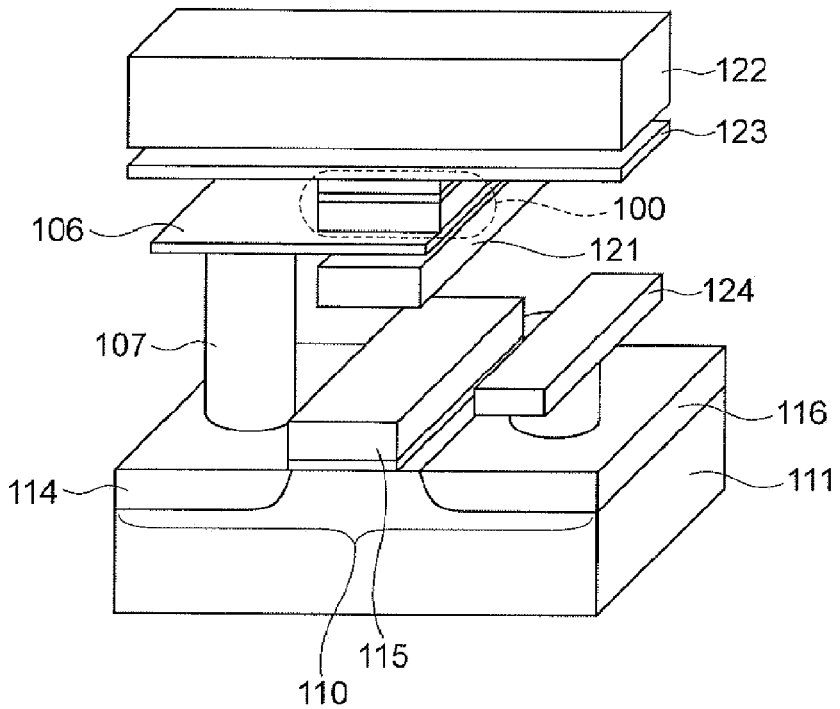
Figure 10:
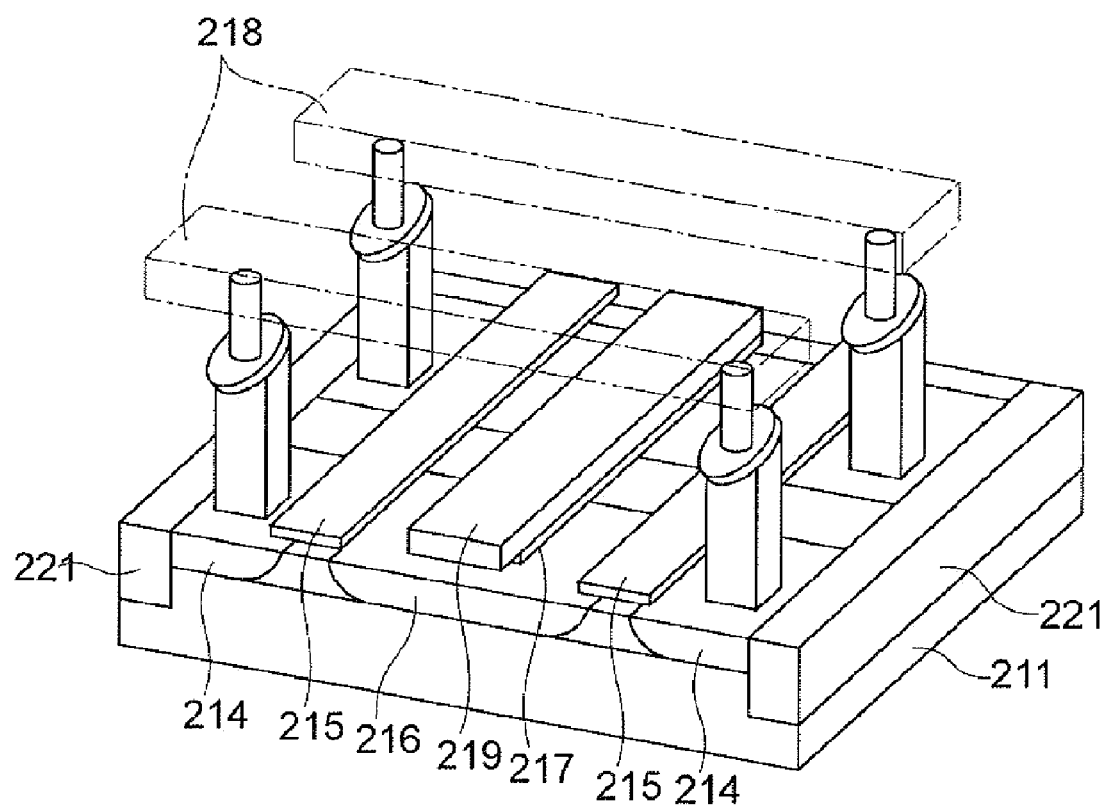
FIG. 10 is a partial perspective view showing a structure of a spin torque MRAM shown in Patent Document 2.
Figure 11:
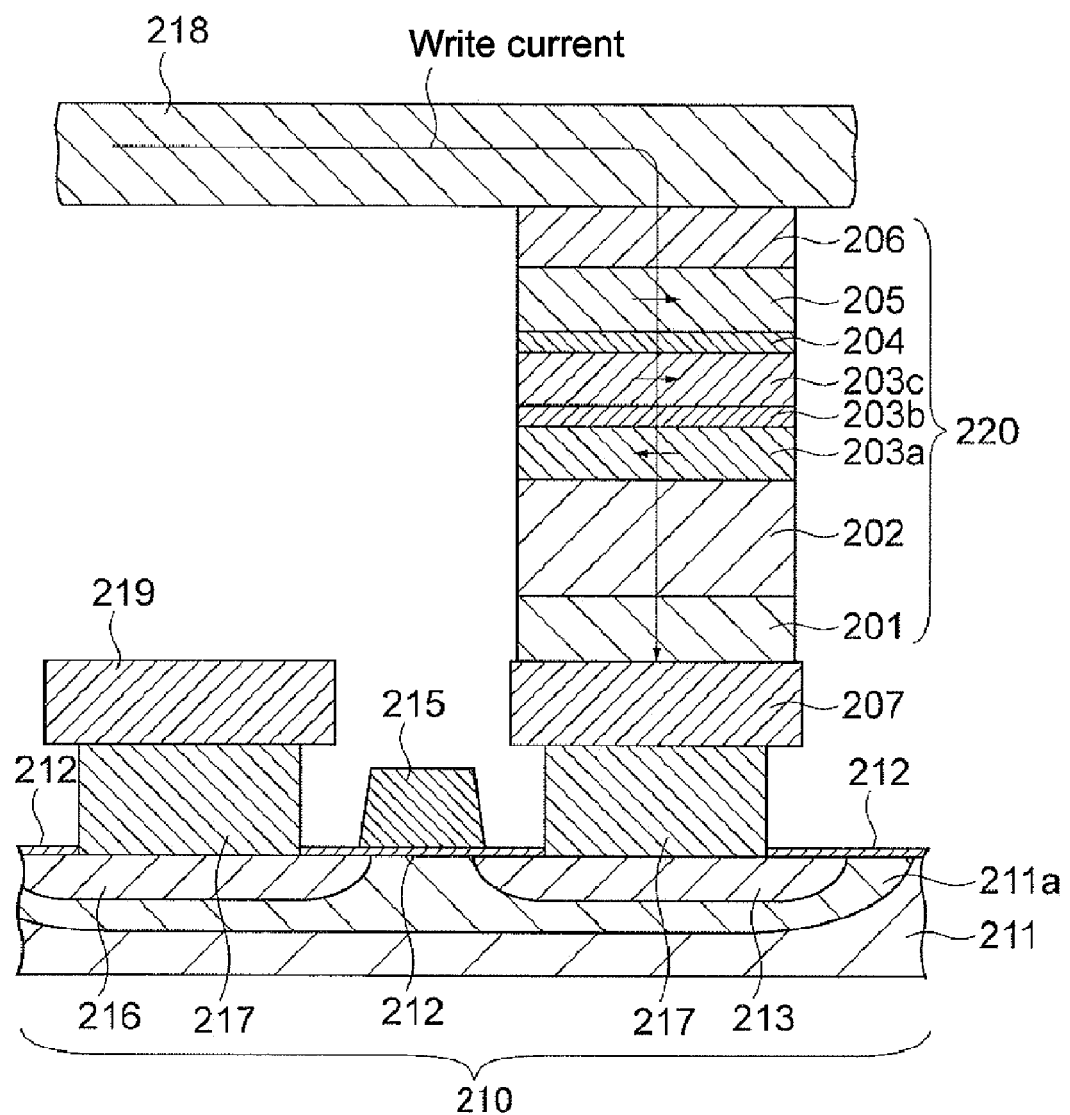
FIG. 11 is a partial cross-sectional diagram showing a memory cell structure of a spin torque MRAM constituted of a spin injection MTJ device.
Figure 12:
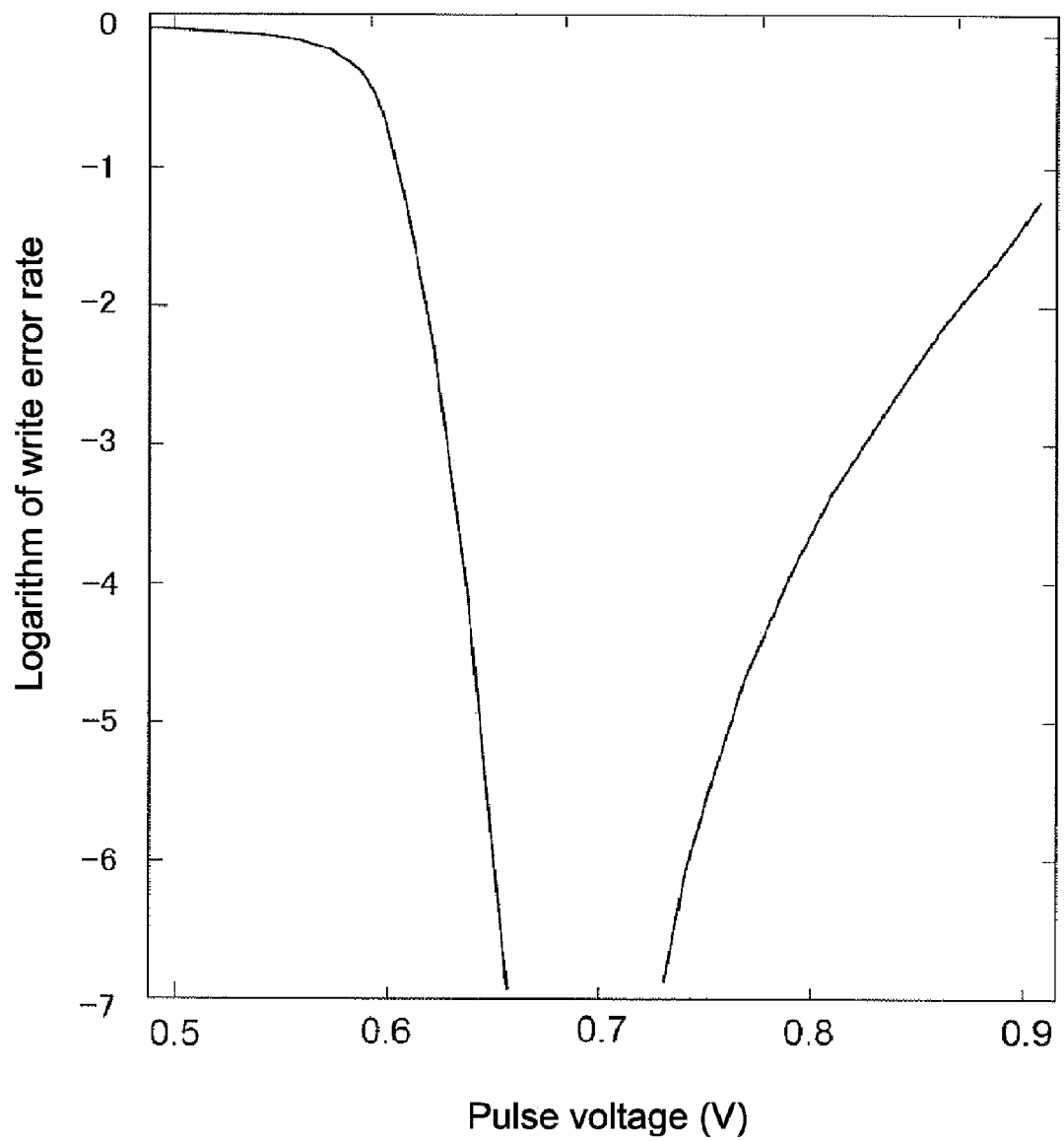
FIG. 12 is a graph showing an example of a relationship between a write pulse voltage and a write error rate.

At this time, the magnetization direction of the magnetization reference layer 3c of the spin injection MTJ device 20 is first "nonparallel" to the magnetization direction of the recording layer 5. When inverting the magnetization direction of the recording layer 5 to be "parallel" to the magnetization direction of the magnetization reference layer 3c by write, a write current having a current density equal to or larger than a threshold value is caused to flow from the recording layer 5 to the magnetization reference layer 3c as shown in FIG. 9. Accordingly, a spin-polarized electron stream having an electron density equal to or larger than a threshold value flows substantively from the magnetization reference layer 3c to the recording layer 5 to thus cause a magnetization inversion.

Conversely, when inverting the magnetization direction of the magnetization reference layer 3c that is "parallel" to the magnetization direction of the recording layer 5 to be "nonparallel", a write current having a current density equal to or larger than a threshold value is caused to flow in the opposite direction, that is, from the magnetization reference layer 3c to the recording layer 5 so that an electron stream having an electron density equal to or larger than a threshold value flows substantively from the recording layer 5 to the magnetization reference layer 3c.

Further, information is read out from the spin injection MTJ device 20 using a TMR effect. While write and read with respect to the spin injection MTJ device 20 both use a mutual action between the electron of the recording layer 5 and the spin-polarized current that flows through the recording layer 5, read is performed in an area where the current density of the spin-polarized current is small, whereas write is performed in an area where the current density of the spin-polarized current is large and exceeds a threshold value.

It should be noted that for preventing a magnetization from being inverted or becoming unstable during a recording operation, the magnetization reference layer 3c may have a magnetization direction fixed in combination with an antiferromagnetic body such as PtMn and IrMn, use a material having a large coercive force such as CoPt, used after being processed in a larger area than the recording layer 5, or magnetized in a certain direction by an external magnetic field.

The magnetization reference layer 3c may be a single ferromagnetic layer or may magnetically bond in a nonparallel manner with the magnetization fixing layer 3a via the intermediate layer 3b constituted of a nonmagnetic metal such as Ru. The magnetization of the magnetization reference layer 3c may either be an in-plane magnetization or a perpendicular magnetization. Further, the magnetization reference layer 3c may be provided below or above the recording layer 5 or both below and above the recording layer 5.

It is desirable for the tunnel insulation layer 4 to be constituted of a ceramic material such as an oxide and a nitride. For obtaining a large magnetoresistance change rate, it is particularly desirable to provide a magnesium oxide MgO layer as the tunnel insulation layer 4 and provide a CoFeB layer on at least the tunnel insulation layer 4 side of the magnetization reference layer 3c and the recording layer 5.

Figure 1:
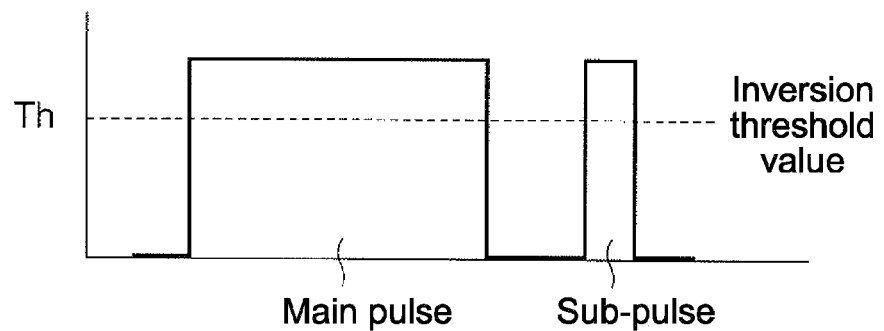
FIG. 1 shows graphs that show examples of a write pulse string in a recording method for a magnetic memory device according to a first embodiment of the present invention.
Figure 1:
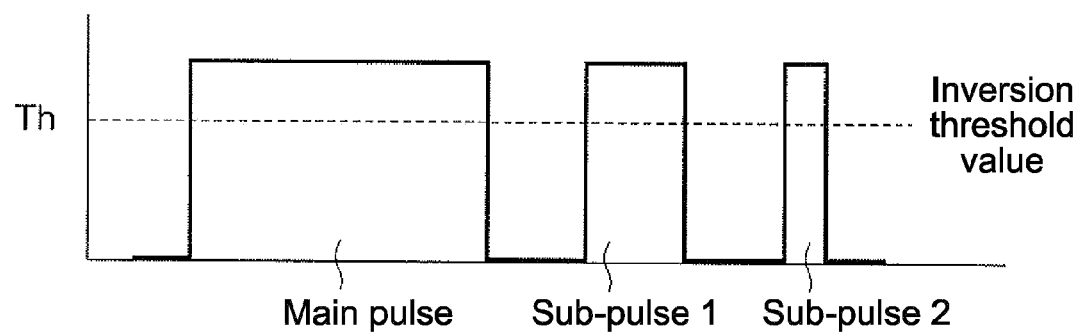

FIG. 1 shows graphs that show examples of a write pulse string in a recording method for a magnetic memory device according to the first embodiment. In the first embodiment, for recording one piece of information, a sub-pulse having the same pulse height as a main pulse but shorter pulse width than the main pulse is applied after the main pulse. The main pulse and the sub-pulse may be controlled by any of voltage control, current control, and power control.

FIG. 1(1) shows a case where one sub-pulse is applied after one main pulse. As in a conventional case where write is performed using a single pulse, the main pulse is a pulse that has sufficient pulse height and pulse width for recording information. In this case, as described above, in the actual write to a spin torque MRAM memory chip having a capacity of several-hundred Mbit, a write pulse considerably larger than a mean value of the inversion threshold values is applied while taking into account a variation of the inversion threshold value of the spin injection MTJ device and a variation of the inversion threshold value that is due to the transistor and wirings. As a result, a high recording voltage error in which a write error rate increases as a write pulse becomes larger appears.

In the conventional write that uses a single pulse, a write error that is caused by write that uses the main pulse is not corrected and left as it is, so a write error rate is high. Moreover, durability with respect to an external magnetic field during write is low. On the other hand, in this embodiment, since a sub-pulse having a pulse height exceeding an inversion threshold value is applied after the main pulse, a write error caused by the main pulse can be highly-likely corrected by write by the sub-pulse. In addition, since the sub-pulse has a shorter pulse width than the main pulse, it is difficult for an excessive amount of energy to be accumulated in the write by the sub-pulse and the high recording voltage error to appear. By the effect described above, a write error rate decreases and durability with respect to an external magnetic field during write is enhanced by the recording method for a magnetic memory device of this embodiment.

At this time, it is desirable to provide a time interval of 3 ns or more, more desirably 5 ns or more between a terminal of the main pulse and a tip end of the sub-pulse. This is for sufficiently securing a time for dissipating an excessive amount of energy accumulated in the write by the main pulse.

FIG. 1(2) shows an example in which two sub-pulses are applied after one main pulse and a main pulse, a sub-pulse 1, and a sub-pulse 2 are structured as a set of three consecutive pulses whose pulse widths gradually reduce, according to claim 2. In this case, the correction is repeated twice by the write that uses the sub-pulse 1 and the write that uses the sub-pulse 2. In addition, the pulse width becomes shorter and it becomes difficult for the high recording voltage error that is caused by an accumulation of an excessive amount of energy to appear for pulses that are applied later in time. Thus, a possibility of the write error rate being suppressed becomes additionally higher.

Figure 2:
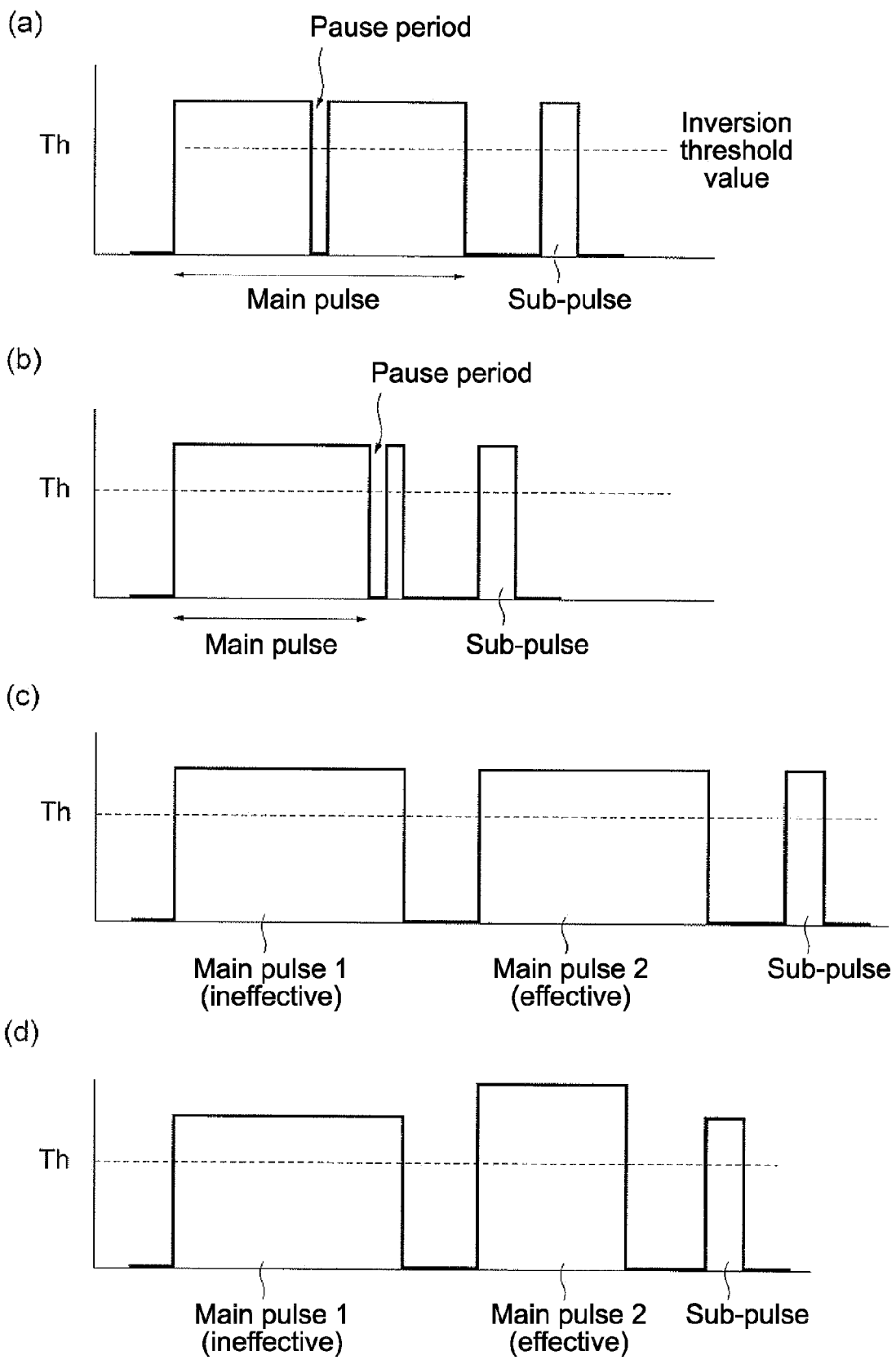
FIG. 2 are graphs showing examples of the write pulse string in the recording method for a magnetic memory device.

FIG. 2 are graphs showing examples of the write pulse string according to the first embodiment, the graphs showing examples of various main pulses. FIGS. 2(a) and 2(b) are examples in which a pause period as short as about 1 ns during which an injection of write power is stopped is provided in a main pulse. Though there is no effect when the pause period is provided at an intermediate portion of the main pulse as shown in FIG. 2(a), when the pause period is provided near a terminal of the main pulse as shown in FIG. 2(b), there is an effect that write power to be injected during a certain period is effectively and gradually reduced and appearances of the high recording voltage error are suppressed (see Japanese Patent Application No. 2008-107768).

FIGS. 2(c) and 2(d) are examples of applying two main pulses. FIG. 2(c) shows a case where a main pulse 1 and a main pulse 2 having the same pulse height and pulse width are applied, and FIG. 2(d) shows a case where a main pulse 1 and a main pulse 2 having different pulse heights and pulse widths are applied. In either case, since the write by the preceding main pulse 1 becomes ineffective by the write by the subsequent main pulse 2, there is no particular effect in applying a plurality of main pulses.

Figure 3:
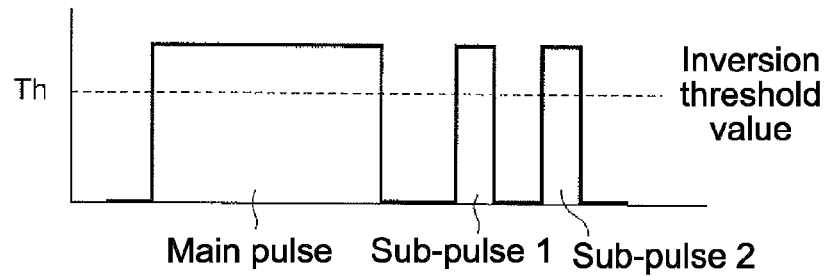
FIG. 3 are graphs showing examples of the write pulse string in the recording method for a magnetic memory device.
Figure 3:
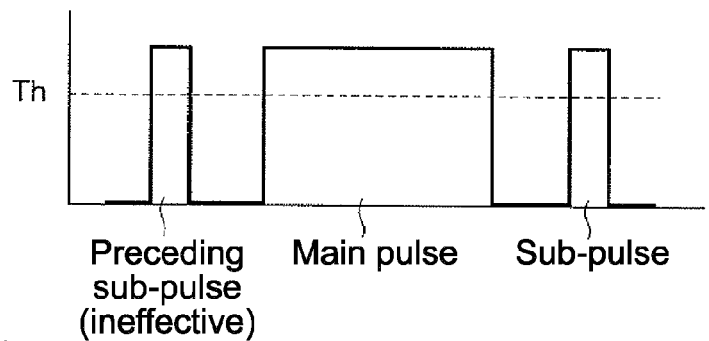
Figure 3:
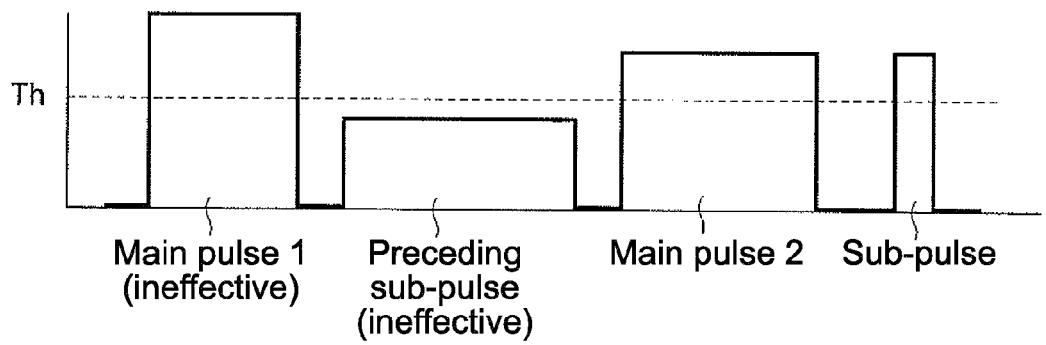

FIG. 3 are graphs showing examples of the write pulse string according to the first embodiment, the graphs showing examples of various sub-pulses. FIG. 3(a) shows an example of applying two sub-pulses, or a plurality of sub-pulses in general, after the main pulse. Since the correction is repeated twice, or a plurality of times in general by the write by the sub-pulse, the possibility of the write error rate being suppressed becomes additionally higher. In this case, a structure in which pulse widths of the sub-pulses gradually reduce is desirable as described above using FIG. 1(b). On the other hand, FIGS. 3(b) and 3(c) show examples in which a sub-pulse preceding a final main pulse is provided, but there is no particular effect in applying such a sub-pulse.

Second Embodiment

In a second embodiment, another example of the recording method for a spin injection MTJ device according to claims 1 and 2 will mainly be described.

Figure 4:
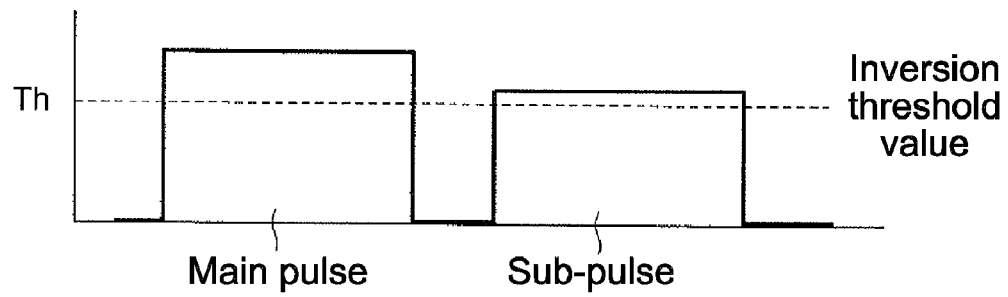
FIG. 4 are graphs showing examples of a write pulse string in a recording method for a magnetic memory device according to a second embodiment of the present invention.
Figure 4:
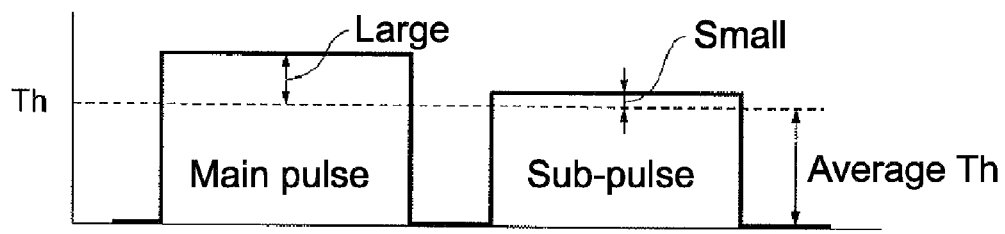
Figure 4:
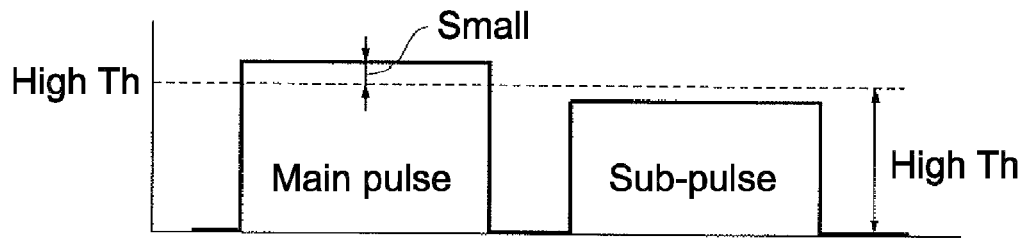
Figure 5:
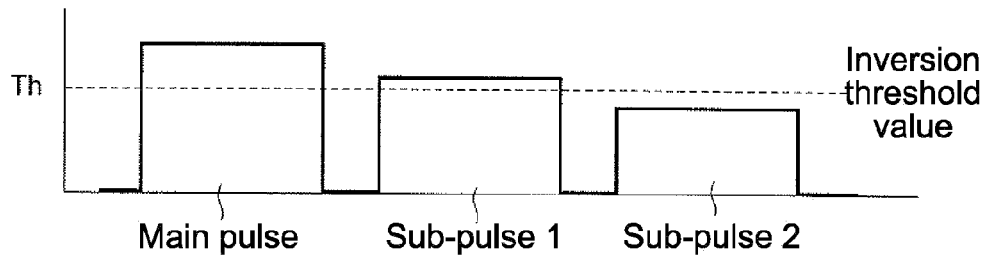
FIG. 5 are graphs showing examples of the write pulse string in the recording method for a magnetic memory device.
Figure 5:
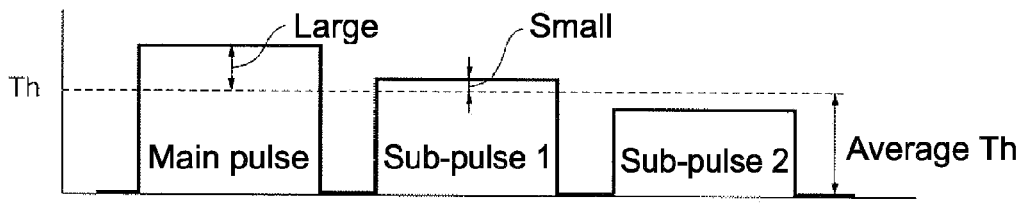
Figure 5:
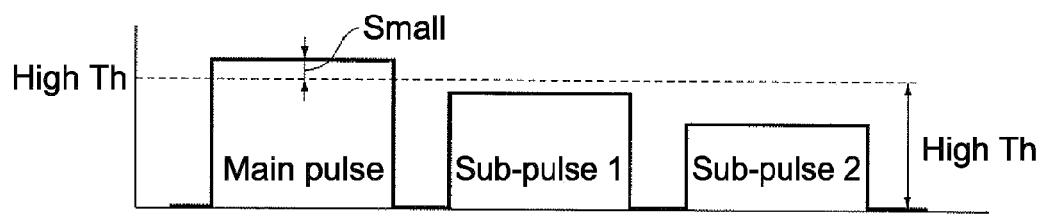
Figure 5:
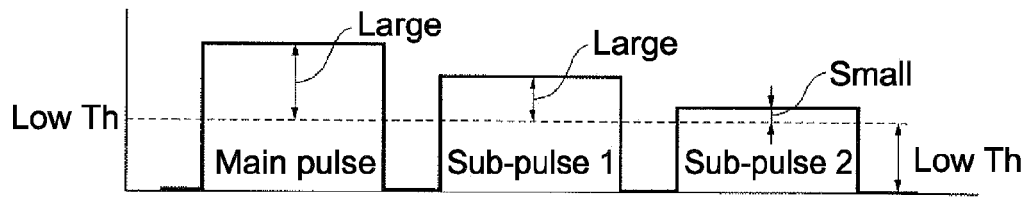

FIGS. 4 and 5 are graphs showing examples of the write pulse string in the recording method for a magnetic memory device according to the second embodiment. In the second embodiment, for recording one piece of information, a sub-pulse having the same pulse width as a main pulse but shorter pulse height than the main pulse is applied after the main pulse. The main pulse and the sub-pulse may be controlled by any of voltage control, current control, and power control.

FIG. 4 show a case where one sub-pulse is applied after one main pulse, and FIGS. 4(a) and 4(b) are explanatory diagrams for explaining the effect. As in the conventional case where write is performed using a single pulse, the main pulse is a pulse that has sufficient pulse height and pulse width for recording information. In this case, as described above, in the actual write to a spin torque MRAM memory chip having a capacity of several-hundred Mbit, a write pulse considerably larger than a mean value of the inversion threshold values is applied while taking into account a variation of the inversion threshold value of the spin injection MTJ device and a variation of the inversion threshold value that is due to the transistor and wirings.

As a result, as shown in FIG. 4(a), in a magnetic memory device that has an average inversion threshold value, the high recording voltage error in which an excessive amount of write power as compared to the inversion threshold value is injected in the write by the main pulse and the write error rate rather increases appears. On the other hand, although the pulse height of the sub-pulse is above an average inversion threshold value, it is not so much that it is prominently higher than the average inversion threshold value. Therefore, write is performed when a sub-pulse is applied to thus correct a write error caused by the main pulse. In addition, since an excessive amount of energy is not much injected in the write by the sub-pulse, it is difficult for the high recording voltage error to appear. By the effect described above, in the magnetic memory device having an average inversion threshold value, the write error rate is lowered, and durability with respect to an external magnetic field during the write is improved.

On the other hand, as shown in FIG. 4(b), in the magnetic memory device having a high inversion threshold value, the pulse height of the sub-pulse may be smaller than the inversion threshold value. In this magnetic memory device, the sub-pulse 2 is ineffective so that write is not performed even when the sub-pulse is applied, and a result of the write by the main pulse is kept as it is. However, in the magnetic memory device having a high inversion threshold value, the pulse height of the main pulse is not so much that it is prominently higher than the inversion threshold value, and the high recording voltage error in which the write error rate increases due to an injection of an excessive amount of energy appears less in the write by the main pulse. In other words, favorable write with a small write error rate is performed by the main pulse, and a correction is unnecessary.

As a result, by using the write pulse string shown in FIG. 4, favorable write with a small write error rate can be performed on both the magnetic memory device having an average inversion threshold value and the magnetic memory device having a high inversion threshold value.

FIG. 5 show examples in which two sub-pulses are applied after one main pulse and a main pulse, a sub-pulse 1, and a sub-pulse 2 are structured as a set of three consecutive pulses whose pulse heights gradually reduce, according to claim 2. In this case, a correction is performed with respect to the magnetic memory device having an average inversion threshold value by the write by the sub-pulse 1 as shown in FIG. 5(a), and the same effect as in the case shown in FIG. 4(a) is obtained. The sub-pulse 2 is ineffective. As shown in FIG. 5(b), in the magnetic memory device having a high inversion threshold value, the pulse height of the main pulse is not so much that it is prominently higher than the inversion threshold value, and favorable write is being performed by the main pulse such that no correction is required as in the case shown in FIG. 4(b). In addition, as shown in FIG. 5(c), with respect to the magnetic memory device having a low inversion threshold value, the correction is repeated twice by the write that uses the sub-pulse 1 and the write that uses the sub-pulse 2. In addition, it becomes difficult for the high recording voltage error that is caused by an injection of an excessive amount of energy to appear for pulses that are applied later in time. Thus, a possibility of the write error rate being suppressed becomes additionally higher.

As a result, by using the write pulse string shown in FIG. 5, more favorable write with a smaller write error rate than in the case of using the write pulse string shown in FIG. 4 can be performed.

EXAMPLES

In the examples, the effect of the present invention was verified by applying the recording methods according to the first and second embodiments of the present invention to a spin torque MRAM constituted of a spin injection MTJ device. Examples 1 and 2 are experiments to be a basis of claims 3 to 5, and Example 4 is an experiment to be a basis of claim 2. In the experiments, the write error rate was measured by repeating deletion, recording, and reproduction while applying a magnetic field in a long-axis direction of the device. The direction of applying a magnetic field is a direction opposite to a magnetization direction to be recorded.

Example 1

In Example 1, the write pulse string shown in FIG. 1(1) was applied in accordance with the recording method for a magnetic memory device according to the first embodiment. The spin torque MRAM used was constituted of the spin injection MTJ device 20 structured by the following layers.

Base layer 1: Ta film having film thickness of 5 nm
Antiferromagnetic layer 2 antiferromagnetic layer 2: PtMn film having film thickness of 30 nm
Magnetization fixing layer 3a: CoFe film having film thickness of 2 nm
Intermediate layer 3b: Ru film having film thickness of 0.7 nm
Magnetization reference layer 3c: CoFeB film having film thickness of 2 nm
Tunnel insulation layer 4: Magnesium oxide MgO film having film thickness of 0.8 nm
Recording layer 5: CoFeB film having film thickness of 3 nm
Protective layer 6: Ta film having film thickness of 5 nm A planar shape of the spin injection MTJ device 20 is an oval having a long axis length of 150 nm to 250 nm and a short axis length of 70 nm to 85 nm. A coercive force of the recording layer 5 is 140 Oe. While applying an external magnetic field of 50 Oe to the spin injection MTJ device 20, a sub-pulse having a pulse voltage of 0.8 V and a pulse width W was applied subsequent to a main pulse having a pulse voltage of 0.8 V and a pulse width of 30 ns. At this time, while variously changing the pulse width W of the sub-pulse and a pulse interval D between a terminal of the main pulse and a tip end of the sub-pulse, a relationship between them and the write error rate was examined.

Figure 6:
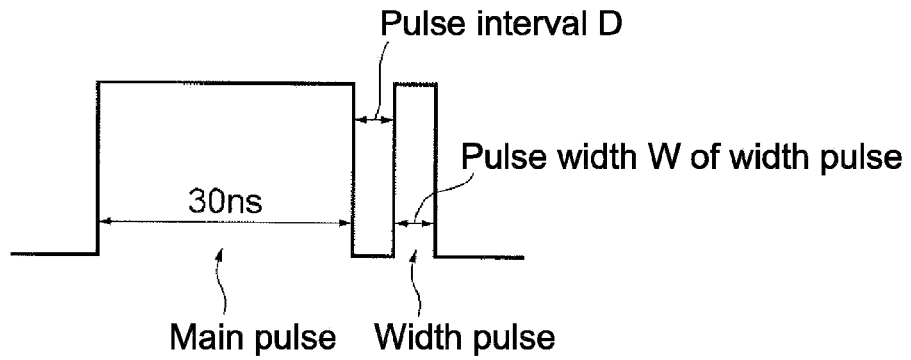
FIG. 6 shows graphs that show a relationship between a write error rate and a pulse interval in a recording method for a magnetic memory device according to Example 1 of the present invention.
Figure 6:
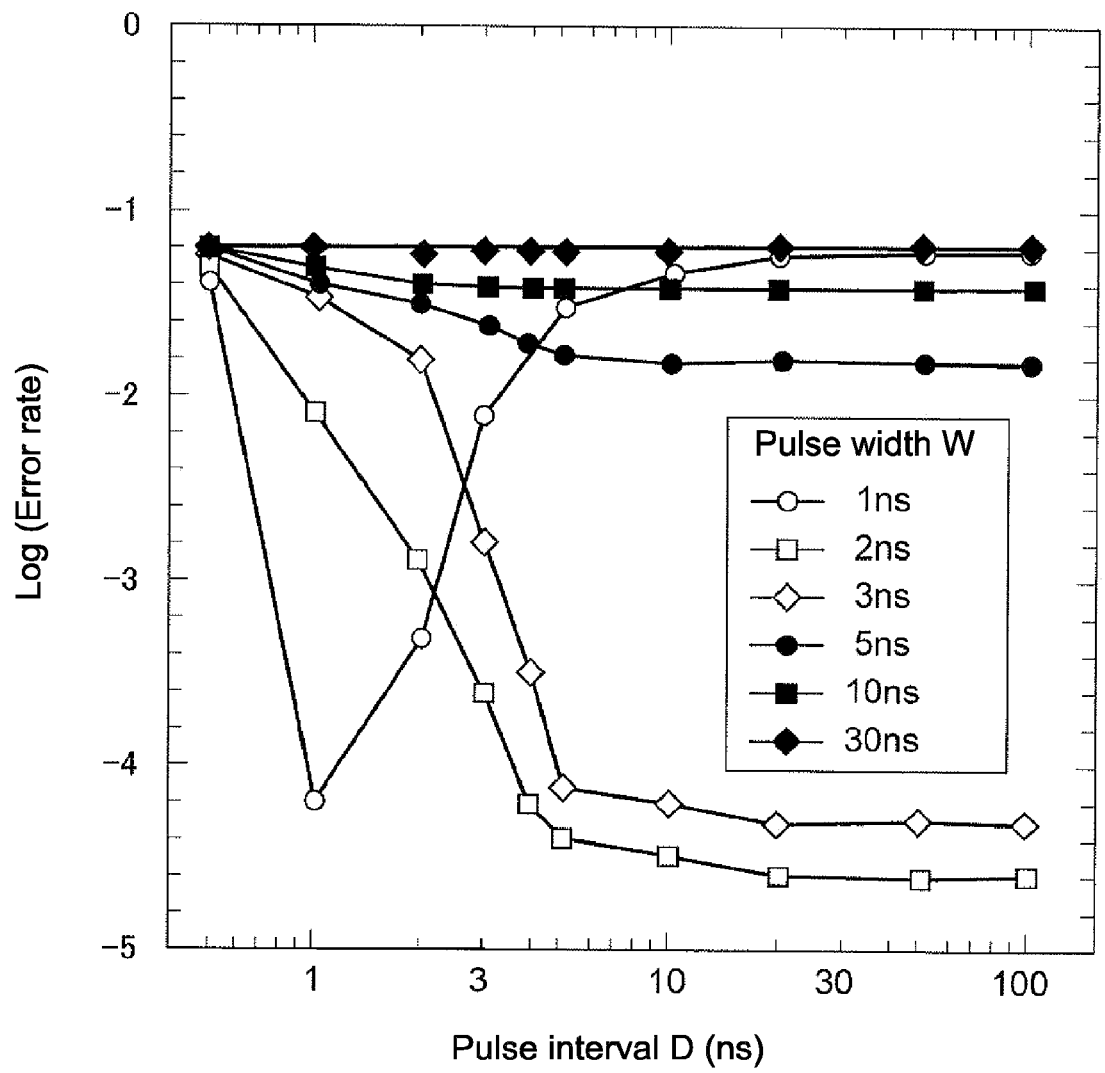

FIG. 6 shows graphs that show the relationship between the write error rate and the pulse interval D in a case where a sub-pulse having a pulse width W of 1 ns to 30 ns is applied. Two tendencies can be seen from FIG. 6. Specifically, in a case where a pulse having a pulse width W of 1 ns is used as the sub-pulse, the error rate reduction effect becomes prominent when the pulse interval D is 1 ns and can be hardly observed when the pulse interval D exceeds 5 ns.

On the other hand, in a case where a pulse having a pulse width W of 2 ns or 3 ns is used as the sub-pulse, the error rate reduction effect of the present invention becomes prominent when the pulse interval D is 3 ns or more, desirably 5 ns or more. The reduction effect becomes small when a pulse having a pulse width W of 5 ns or more is used as the sub-pulse and cannot be observed at all when the pulse width W of the sub-pulse becomes 30 ns, that is, the same as that of the main pulse.

Example 2

In Example 2, the write pulse string shown in FIG. 4 was applied in accordance with the recording method for a magnetic memory device according to the second embodiment. The spin torque MRAM used has the same layer structure as the spin injection MTJ device 20 used in Example 1 and is constituted of the spin injection MTJ device 20 in which the coercive force of the recording layer 5 is 125 Oe. While applying an external magnetic field of 50 Oe to the spin injection MTJ device 20, a sub-pulse having a pulse voltage V and a pulse width of 30 ns was applied subsequent to a main pulse having a pulse voltage of 0.9 V and a pulse width of 30 ns. At this time, while variously changing the pulse voltage V of the sub-pulse and a pulse interval D between a terminal of the main pulse and a tip end of the sub-pulse, a relationship between them and the write error rate was examined.

Figure 7:
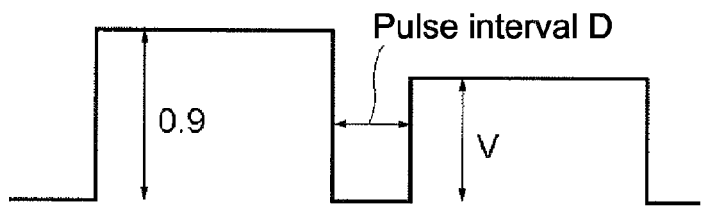
FIG. 7 shows graphs that show a relationship between a write error rate and a sub-pulse height in a recording method for a magnetic memory device according to Example 2 of the present invention.
Figure 7:
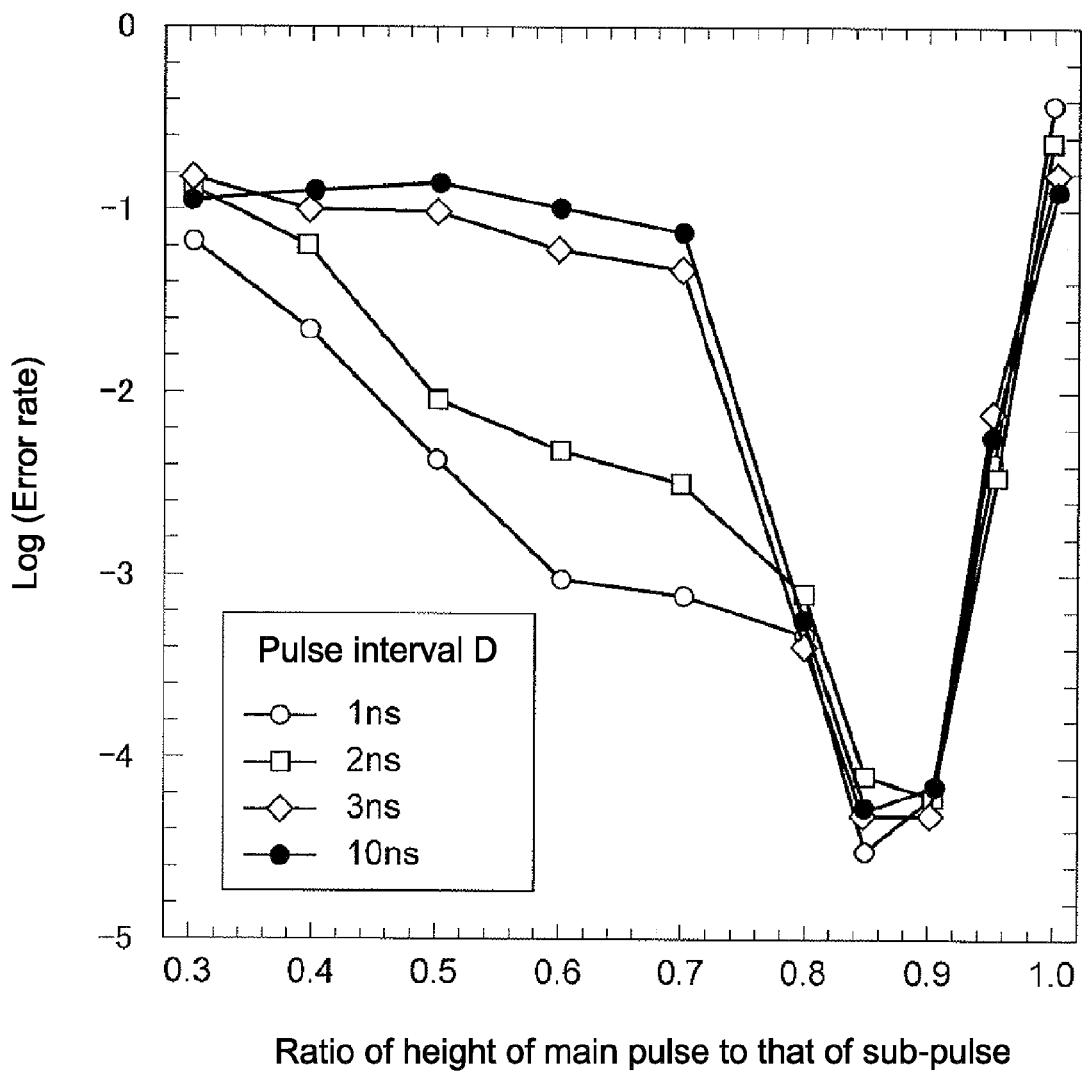

FIG. 7 shows graphs that show a result of examining the relationship between the write error rate and a ratio of a pulse voltage of the main pulse to that of the sub-pulse while changing the pulse interval D within the range of 1 ns to 10 ns. Though not as clear as in FIG. 6, there is also considered to be two tendencies in FIG. 7.

In a case where the pulse interval D is 3 ns or more, the reduction effect appears only when the ratio of the pulse voltage of the main pulse to that of the sub-pulse is 0.7 or more and 1.0 or less and becomes particularly prominent when the pulse voltage ratio is 0.8 or more and 0.95 or less. The fact that there is a lower limit to an effective pulse voltage of the sub-pulse indicates that write by the sub-pulse is being performed.

On the other hand, in a case where the pulse interval D is 1 ns or 2 ns, the reduction effect that appears when the ratio of the pulse voltage of the main pulse to that of the sub-pulse is 0.8 or more and 0.95 or less is considered to be the effect of the present invention as in the case described above, and the reduction effect that appears when the pulse voltage ratio is 0.3 or more and 0.95 or less and the pulse voltage of the sub-pulse is smaller than the inversion threshold value is considered to be an effect of another invention.

Example 3

In Example 3, durability with respect to an external magnetic field in the recording method for a magnetic memory device according to the first embodiment was examined. The spin torque MRAM used has the same layer structure as the spin injection MTJ device 20 used in Example 1 and is constituted of the spin injection MTJ device 20 in which the coercive force of the recording layer 5 is 212 Oe. While applying an external magnetic field of 0 to 200 Oe to the spin injection MTJ device 20, the write error rate in a case where the write pulse voltage is changed within the range of 0.5 V to 0.7 V was examined. A polarization of the voltage was positive.

Figure 8:
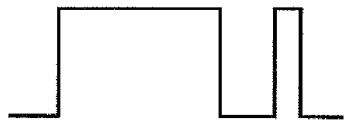
FIG. 8 are graphs showing durability with respect to an external magnetic field in a recording method for a magnetic memory device according to Example 3 of the present invention.
Figure 8:
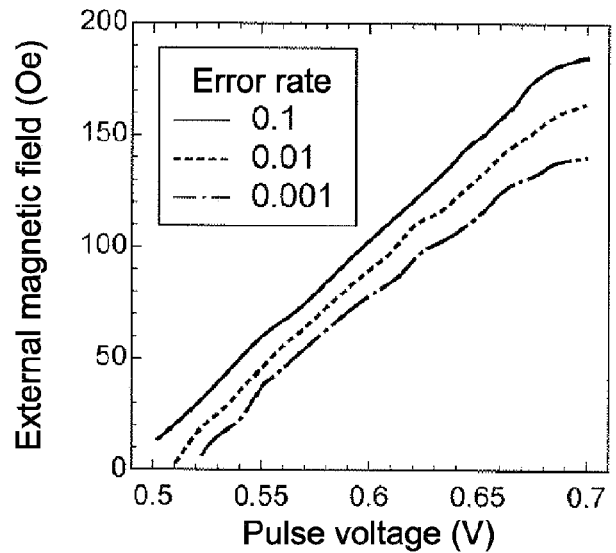
Figure 8:
Figure 8:
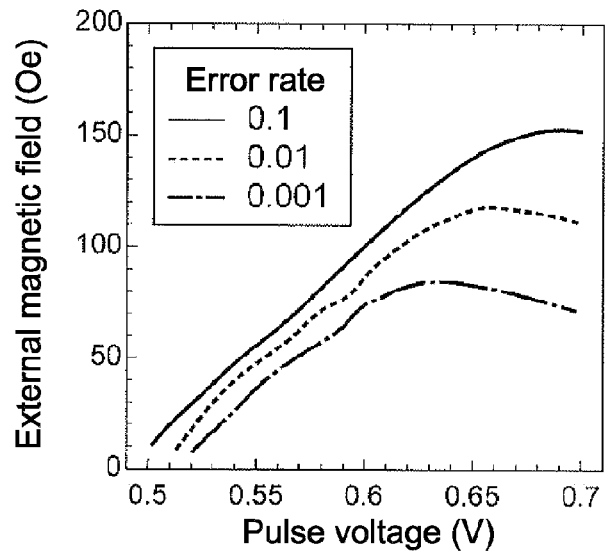

FIG. 8 are graphs each obtained by connecting, with a contour line, positions at which the write error rate becomes 0.1, 0.01, and 0.001 with respect to the external magnetic field and the write pulse voltage. Since it becomes necessary to write information to the recording layer against a large external magnetic field when the external magnetic field becomes large, a larger write pulse voltage becomes necessary for maintaining the same write error rate. Therefore, the contour lines are predicted to be upward-sloping curves in FIG. 8. Moreover, it is predicted that, if the external magnetic field is constant, the write error rate becomes smaller as the pulse voltage increases.

FIG. 8(*b*) shows a result of a comparative example in which recording is performed with a single pulse having a pulse width of 100 ns. In this case, a phenomenon in which, although the contour line becomes an upward-sloping curve as predicted in an area where the external magnetic field is relatively small, the write error rate is not suppressed even when the pulse voltage is increased regardless of the prediction in an area where the external magnetic field is large appears. In this area, when the external magnetic field is constant, the high recording voltage error described above in which the write error rate rather increases as the pulse voltage becomes larger is occurring.

On the other hand, FIG. 8(*a*) shows a case where a sub-pulse having a pulse width of 3 ns is applied after providing a pulse interval of 10 ns after a main pulse having a pulse width of 100 ns. In this case, the contour line becomes an upward-sloping curve until reaching the area where the external magnetic field is large. Moreover, if the external magnetic field is constant, the write error rate becomes smaller as the pulse voltage becomes larger. As described above, by the recording method according to the first embodiment, the write error rate in the case where the write pulse voltage is increased can be reduced and an operational range of write can be expanded, with the result that durability with respect to a magnetic field is improved when a large external magnetic field acts.

As described above, by the recording method for a magnetic memory device according to the first embodiment, a recording operation with less errors becomes possible in a wide operation environment that receives an action of the external magnetic field, a thickness and size of a magnetic shield that shields the external magnetic field can be reduced in a large-capacity spin torque MRAM, and the spin torque MRAM can thus be reduced in size, weight, and cost.

Example 4

In Example 4, the write error rate in a case where a pulse string obtained by combining sub-pulses having various pulse widths and pulse intervals with a main pulse having a pulse width of 10 ns is used as the write pulse string was examined. At this time, based on the first embodiment, the pulse heights of the main pulse and the sub-pulses are the same, and the pulse width of the sub-pulse that is applied later is the same as or shorter than the pulse width of the sub-pulse that is applied before that. The spin torque MRAM used has the same layer structure as the spin injection MTJ device 20 used in Example 1 and is constituted of the spin injection MTJ device 20 in which the coercive force of the recording layer 5 is 130 Oe. While applying an external magnetic field of 50 Oe to the spin injection MTJ device 20, the main pulse and sub-pulses having a pulse voltage of 1.1 V were applied.

The results are shown in Table 1. Table 1 shows pulse widths and pulse intervals of the main pulse and sub-pulses in time series and lastly shows the write error rate obtained when such a write pulse string is used.

TABLE 1

|  | Sub-pulse (ns) | Pulse interval (ns) | Main pulse (ns) | Pulse interval 1 (ns) | Sub-pulse 1 (ns) | Pulse interval 2 (ns) | Sub-pulse 2 (ns) | Pulse interval 3 (ns) | Sub-pulse 3 (ns) | Write error rate (%) |
|---|---|---|---|---|---|---|---|---|---|---|
| Pulse Example 1 |  |  | 10 | 10 | 2 |  |  |  |  | $4.2 \times 10^{-3}$ |
| Pulse Example 2 |  |  | 10 | 10 | 3 |  |  |  |  | $1.3 \times 10^{-3}$ |
| Pulse Example 3 |  |  | 10 | 10 | 3 | 10 | 2 |  |  | $2.8 \times 10^{-5}$ |
| Pulse Example 4 |  |  | 10 | 10 | 3 | 10 | 1 | 1 | 1 | $7.6 \times 10^{-4}$ |
| Pulse Example 5 |  |  | 10 | 10 | 3 | 5 | 2 | 1 | 1 | $1.8 \times 10^{-5}$ |
| Comparative Example 1 |  |  | 10 |  |  |  |  |  |  | $8.0 \times 10^{-2}$ |
| Comparative Example 2 | 3 | 10 | 10 |  |  |  |  |  |  | $8.1 \times 10^{-2}$ |
| Pulse Example 6 | 3 | 10 | 10 | 10 | 3 |  |  |  |  | $1.1 \times 10^{-3}$ |

TABLE 1-continued

| | Sub-pulse (ns) | Pulse interval (ns) | Main pulse (ns) | Pulse interval 1 (ns) | Sub-pulse 1 (ns) | Pulse interval 2 (ns) | Sub-pulse 2 (ns) | Pulse interval 3 (ns) | Sub-pulse 3 (ns) | Write error rate (%) |
|---|---|---|---|---|---|---|---|---|---|---|
| Pulse Example 7 | | | 10 | 1 | 1 | | | | | $2.2 \times 10^{-3}$ |
| Pulse Example 8 | | | 10 | 1 | 1 | 1 | 1 | | | $1.7 \times 10^{-4}$ |

Comparative Example 1 is a case where a single pulse is applied, and the write error rate in this case was $8.0 \times 10^{-2}$. Comparative Example 2 is a case where a sub-pulse is applied before a main pulse. The write error rate in this case was $8.1 \times 10^{-2}$ and was within an allowable error range as compared to Comparative Example 1, thus indicating that the sub-pulse preceding the main pulse is ineffective.

Pulse String 1 and Pulse String 2 are cases where one sub-pulse is applied 10 ns after a main pulse, and a pulse width of 3 ns is more excellent for the sub-pulse than 2 ns in this case. This may be because the pulse width of 2 ns is a little too short for sufficiently performing write by the sub-pulse. Pulse Strings 3 to 5 are cases where two or three sub-pulses are applied after a main pulse, and the write error rate is reduced as compared to Pulse String 2 with a single sub-pulse.

A pulse structure of Pulse String 6 after a main pulse is the same as that of Pulse String 2 except for a preceding ineffective sub-pulse, and the write error rate is also substantially the same. Pulse Strings 7 and 8 are cases where a short sub-pulse having a pulse width of 1 ns is applied 1 ns after a main pulse, and the write error rate was reduced as compared to Comparative Example 1. Also in this case, the write error rate was reduced more in Pulse String 8 in which two short sub-pulses each having a pulse width of 1 ns are applied successively than in Pulse String 7 with a single sub-pulse. It should be noted that as described above, the effect of the present invention and the effect of another invention may be overlapped with the results of Pulse Strings 7 and 8.

Next, a write pulse generator circuit of the above embodiments will be described.

Figure 13:
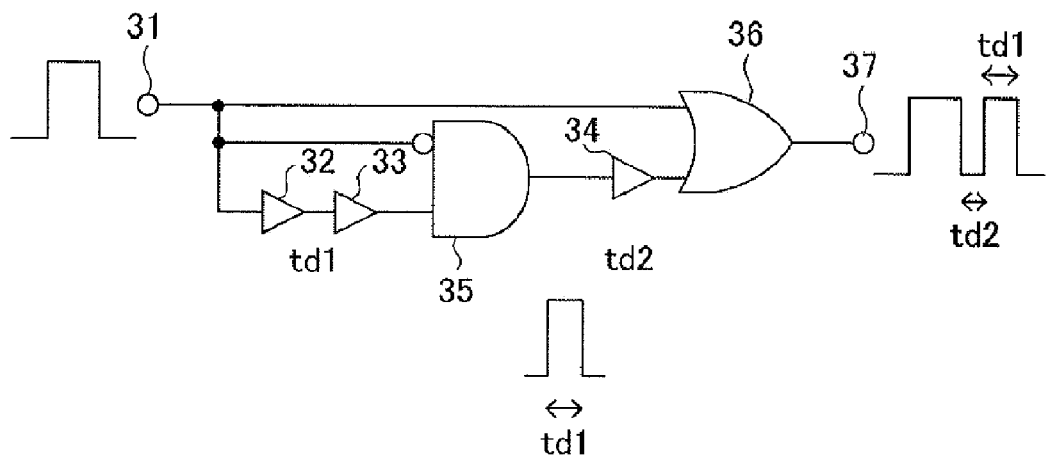
FIG. 13 is a diagram showing a structure of a write pulse generator circuit for generating a write pulse constituted of a main pulse and a sub-pulse of the above embodiment from one rectangular pulse.

FIG. 13 is a diagram showing a structure of a write pulse generator circuit for generating a write pulse constituted of a main pulse and a sub-pulse of the above embodiment from one rectangular pulse.

A write pulse generator circuit 30 is structured using a plurality of buffers 32, 33, and 34 and a plurality of logic circuits 35 and 36. A rectangular pulse signal is input to an input terminal 31 of the write pulse generator circuit 30. The rectangular pulse signal input to the input terminal 31 is input to one input terminal of the logic circuit 36 of an OR logic, a noninversion input terminal of the logic circuit 35 of an AND logic, and the buffers 32 and 33 connected in series. Here, the buffers 32 and 33 connected in series are for generating a width of a sub-pulse, and an arbitrary width td1 of a sub-pulse can be selected by selecting a delay time of the buffers 32 and 33. Outputs of the buffers 32 and 33 are input to the noninversion input terminal of the logic circuit 35 of the AND logic. An output of the logic circuit 35 of the AND logic is input to the other one of the input terminals of the logic circuit 36 of the OR logic via the buffer 34. Here, the buffer 34 is for generating a time td2 between a main pulse and a sub-pulse, and an arbitrary time td2 can be set by selecting a delay time of the buffer 34. A write pulse constituted of a main pulse and a sub-pulse is obtained by the logic circuit 36 of the OR logic and output from an output terminal 37 of the write pulse generator circuit 30.

Figure 14:
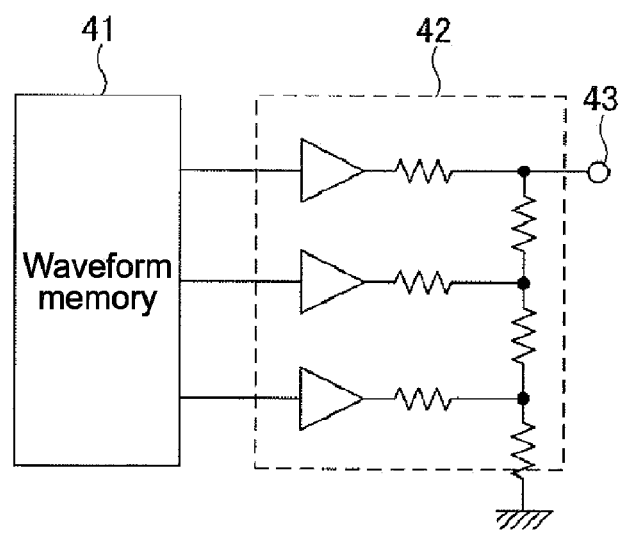
FIG. 14 is a diagram showing a structure of a write pulse generator circuit for generating a write pulse using a waveform memory and a D/A conversion circuit.

FIG. 14 is a diagram showing a structure of a write pulse generator circuit 40 for generating a write pulse using a waveform memory and a D/A conversion circuit. A waveform memory 41 stores waveform data of a write pulse constituted of a main pulse and a sub-pulse. With N bits whose output level can be selected from $2^N$ stages as 1 word, the waveform data of a write pulse is constituted of time-series data of a plurality of words. N ports for read are provided to the waveform memory 41, and the N ports are respectively connected to N input terminals of a D/A conversion circuit 42. The D/A conversion circuit 42 receives an input of waveform data of a write pulse for each N-bit data (1 word) from the waveform memory 41, converts it into an analog signal, and outputs it as a write pulse. The D/A conversion circuit 42 can be constituted of, for example, a ladder resistance circuit. By using such a write pulse generator circuit, a write pulse waveform can be obtained with a high degree of freedom, and write pulses of the above embodiments can be obtained easily with a high degree of freedom.

It should be noted that in the example of FIG. 8, the bit count N of 1 word has been set to "3" so that the output level can be selected from $2^3$ stages. However, the present invention is not limited thereto.

Heretofore, the present invention has been described based on the embodiments, but the present invention is of course not limited to those examples and can be changed as appropriate without departing from the gist of the invention.

INDUSTRIAL APPLICABILITY

According to the present invention, a spin injection magnetization inversion-type MTJ device with improved transient characteristics at a time of write, less write failures, and a small threshold value of a write current density and with which high integration, high speed, and low power consumption are possible can be realized so as to contribute to a practical realization of a compact, light, and inexpensive nonvolatile memory.

DESCRIPTION OF SYMBOLS

1 base layer
2 antiferromagnetic layer
3a magnetization fixing layer
3b intermediate layer
3c magnetization reference layer
4 tunnel insulation layer
5 recording layer
6 protective layer
7 connection plug
10 selection transistor
11 semiconductor substrate 11a well area
12 gate insulation film
13 source electrode
14 source area
15 gate electrode
16 drain area
17 drain electrode
18 bit line
19 row wiring
20 spin injection magnetization inversion MTJ device
21 device-isolated structure
30, 40 write pulse generator circuit

The invention claimed is:

1. A recording method for a magnetic memory device including (a) at least a recording layer that is (1) constituted of a ferromagnetic conductor, (2) capable of changing a magnetization direction, and (3) holds information as a magnetization direction of a magnetic body and (b) a magnetization reference layer whose magnetization direction is fixed and (a) that is provided with respect to the recording layer with an insulation layer interposed therebetween, (b) constituted of a ferromagnetic conductor, and (c) becomes a reference of the magnetization direction, the magnetic memory device being recorded with information by a current flowing between the recording layer and the magnetization reference layer via the insulation layer, the recording method comprising:
applying, when recording one piece of information, one or more main pulses and one or more sub-pulses in the same direction; and
applying the one or more sub-pulses after the one or more main pulses, wherein,
the one or more sub-pulses to be applied after the one or more main pulses is each a pulse (a) with a pulse width that is shorter than that of the one or more main pulses (b) with a pulse height that is smaller than that of the one or more main pulses, or (c) both.

2. The recording method for a magnetic memory device according to claim 1, wherein at least one set of three consecutive pulses, the pulse widths or pulse heights reduce gradually, is provided in a pulse string constituted of the one or more main pulses and the one or more sub-pulses to be applied after the one or more main pulses.

3. The recording method for a magnetic memory device according to claim 1, wherein a time interval of 3 ns or more is provided between a terminal end of the one or more main pulses and a tip end of the one or more sub-pulses to be applied after the one or more main pulses.

4. The recording method for a magnetic memory device according to claim 1 or 2, wherein;
in a set of two consecutive pulses arbitrarily selected from a pulse string constituted of the one or more main pulses and the one or more sub-pulses to be applied after the one or more main pulses, the subsequent pulse has (a) a pulse width that (a) is 2 ns or more and 10 ns or less, (b) a pulse height is 0.7 times or more and 0.95 times or less the pulse height of the previous pulse, or (c) both, and
a time interval of 5 ns or more is provided between a terminal end of the previous pulse and a tip end of the subsequent pulse.

5. The recording method for a magnetic memory device according to claim 1 or 2, wherein; in a set of two consecutive pulses arbitrarily selected from a pulse string constituted of the one or more main pulses and the one or more sub-pulses to be applied after the one or more main pulses, the subsequent pulse has (a) a pulse width that is 3 ns or less, (b) that a pulse height is 0.8 times or less the pulse height of the previous pulse, or (c) both, and a time interval between a terminal end of the previous pulse and a tip end of the subsequent pulse is smaller than 5 ns.

6. The recording method for a magnetic memory device according to claim 1 or 2, wherein;
in a set of two consecutive pulses arbitrarily selected from a pulse string constituted of the one or more main pulses and the one or more sub-pulses to be applied after the one or more main pulses, the subsequent pulse has (a) a pulse width is 3 ns or less, (b) a pulse height is 0.95 times or less the pulse height of the previous pulse, or (c) both, and
a time interval between a terminal end of the previous pulse and a tip end of the subsequent pulse is smaller than 5 ns.

* * * * *